United States Patent
Itoh

(10) Patent No.: US 7,088,167 B2
(45) Date of Patent: Aug. 8, 2006

(54) LEVEL CONVERSION FOR USE IN SEMICONDUCTOR DEVICE

(75) Inventor: Kunihiro Itoh, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/044,030

(22) Filed: Jan. 28, 2005

(65) Prior Publication Data

US 2005/0127977 A1    Jun. 16, 2005

Related U.S. Application Data

(63) Continuation of application No. PCT/JP03/02178, filed on Feb. 27, 2003.

(51) Int. Cl.
*H03L 5/00* (2006.01)

(52) U.S. Cl. ........................ 327/333; 326/81

(58) Field of Classification Search ............. 327/333, 327/319, 328; 326/80–81, 62–63, 68
See application file for complete search history.

(56) References Cited

U.S. PATENT DOCUMENTS

| | | | |
|---|---|---|---|
| 4,713,600 A | 12/1987 | Tsugaru et al. | 323/351 |
| 4,920,284 A | 4/1990 | Denda | 307/475 |
| 5,808,480 A | 9/1998 | Morris | 326/81 |
| 6,806,757 B1 * | 10/2004 | Mukai | 327/333 |
| 6,833,747 B1 * | 12/2004 | Correale, Jr. | 327/333 |
| 6,861,873 B1 * | 3/2005 | Correale, Jr. | 326/81 |
| 6,919,737 B1 * | 7/2005 | Alvandpour et al. | 326/81 |
| 2005/0190612 A1 * | 9/2005 | Kanno et al. | 365/189.09 |

FOREIGN PATENT DOCUMENTS

JP    63-099615    4/1988

* cited by examiner

*Primary Examiner*—My-Trang Nu Ton
(74) *Attorney, Agent, or Firm*—Arent Fox PLLC

(57) ABSTRACT

In an operation to supply an input signal IN having an amplitude equal to a first power-supply voltage VDD1 to the gate of a PMOS transistor PM51 operating at a second power-supply voltage VDD2 higher than the first power-supply voltage VDD1, the levels of signals are converted by using PMOS transistors PM1 to PM4. A signal obtained as a result of the conversion is output from the PMOS transistors PM1 and PM2, being used for controlling electrical conduction of a PMOS transistor PM51.

29 Claims, 13 Drawing Sheets

LEVEL CONVERSION FOR USE IN SEMICONDUCTOR DEVICE

CROSS-REFERENCE TO RELATED APPLICATIONS

This nonprovisional application is a continuation application of and claims the benefit of International Application No. PCT/JP2003/02178, filed Feb. 27, 2003. The disclosure of the prior application is hereby incorporated herein in its entirety by reference.

BACKGROUND OF THE INVENTION

1. Field of the Invention

The present invention relates to a semiconductor device having an interface for converting the level of a signal to a voltage level higher than the voltage of its own power supply. More particularly, the present invention relates to a semiconductor device capable of converting the level of a signal to a high voltage level without continuous current consumption.

2. Description of Related Art

Japanese unexamined patent publication No. H10(1998)-22810 discloses an output buffer circuit capable of outputting a signal having a voltage level higher than the voltage of its own power supply. In accordance with the above publication '810, as shown in FIG. 15, the voltage level of an output signal OUT is sequentially amplified from a low voltage level VDD to higher voltage levels (VL1, VH1), (VL2, VH2), (VL3, VH3) and (VL3, VDD2) by using four intermediate inverters operating at power-supply voltages at sequentially increasing voltage levels in order to raise the voltage level of the output signal OUT to a high voltage level VDD2.

The voltage levels VL1 to VL3 and VH1 to VH3 of the power-supply voltages of the intermediate inverters are obtained as a result of applying a voltage division potentiometer comprising resistors 105 to 111 to the high-level voltage VDD2.

In a state where the output buffer circuit disclosed in the publication '810 is capable of outputting the output signal OUT, the voltage levels VL1 to VL3 and VH1 to VH3 of the power-supply voltages to be supplied to the intermediate inverters are obtained as a result of dividing a power-supply voltage VDD2 through the use of a voltage division potentiometer comprising the resistors 105 to 111. Thus, after a transition of a logic level of an input signal IN has been propagated through the intermediate inverters, the logic states of the input/output signals of the intermediate inverters are fixed and, in spite of the fact that no current is consumed in the intermediate inverters, steady current consumption occurs from the power-supply voltage VDD2 through the resistors 105 to 111.

In applications to a technical field of mainly portable devices required to operate at a low current consumption, such steady current consumption raises a problem.

It is thus an object or the present invention, which addresses the problem, to provide a semiconductor device capable of converting the level of a signal to a high voltage level without causing steady current consumption in interfacing a signal between a first circuit group operating at a first power-supply voltage and a second circuit group operating at a second power-supply voltage, which is higher than the first power-supply voltage.

SUMMARY OF THE INVENTION

In order to achieve the object described above, a semiconductor device according to a first aspect of the invention is characterized in that the semiconductor device comprises: a first circuit group operating by being driven by a power supply at a voltage level between a reference voltage and a first power-supply voltage, a second circuit group, which operates by being driven by a power supply at a voltage level between the reference voltage and a second power-supply voltage, which is higher than the first power-supply voltage, a high-side voltage-controlled device having a first type of electrical conduction at an input stage of the second circuit group for controlling an output of the second power-supply voltage; and a level conversion circuit, which is provided as an interface from the first circuit group to the second circuit group, operates by being driven by a power supply at a voltage level between the first power-supply voltage and the second power-supply voltage to control electrical conduction of the high-side voltage-controlled device and has: a first voltage-controlled device, which has the first type of electrical conduction and is provided between the high-side voltage-controlled device and a line of the first power-supply voltage for supplying the first power-supply voltage with the high-side voltage-controlled device put in an electrically conductive state; and a second voltage-controlled device, which has the first type of electrical conduction and is provided between the high-side voltage-controlled device and a line of the second power-supply voltage for supplying the second power-supply voltage with the high-side voltage-controlled device put in an electrically non-conductive state.

As an interface between the first and second circuit groups, the semiconductor device according to the first aspect of the invention may have a level conversion circuit, which operates between the first power-supply voltage and the second power-supply voltage. In the level conversion circuit, the first voltage-controlled device controlled by a voltage supplies the first power-supply voltage whereas the second voltage-controlled device controlled by a voltage supplies the second power-supply voltage to put the high-side device, which is employed in the second circuit group controlled by a voltage and provided with a characteristic of the first type of electrical conduction, in an electrically conductive state or an electrically non-conductive state.

Thus, since the level conversion circuit has a configuration of supplying the second power-supply voltage relative to the first power-supply voltage instead of being relative to the reference voltage, a difference in supplied voltage is a difference in voltage level between the first power-supply voltage and the second power-supply voltage. Accordingly, a configuration element incapable of withstanding the second power-supply voltage can be employed in the interface. In addition, in order to assure a withstand-voltage characteristic, it is not necessary to generate an intermediate third power-supply voltage by proportional division of the first power-supply voltage and the second power-supply voltage. Thus, there is no current consumption accompanying the proportional division.

Within the range of the withstand voltage of the device and without steady current consumption, the first power-supply voltage or the second power-supply voltage is supplied to the high-side voltage-controlled device to put the high-side voltage-controlled device in an electrically conductive state or an electrically non-conductive state in accordance with the supplied voltage with the second power-supply voltage taken as a reference. In this way, electrical conduction of the high-side voltage-controlled device can be controlled.

Since the first and second voltage-controlled devices employed in the level conversion circuit have the same type of electrical conduction as the high-side voltage-controlled device, the control of the first and second power-supply voltages each appearing in the level conversion circuit as a floated voltage relative to the reference voltage can be executed with ease.

Further, a semiconductor device according to a second aspect of the invention is characterized by comprising: a first circuit group operating by being driven by a power supply at a voltage level between a reference voltage and a first power-supply voltage, a second circuit group, which operates by being driven by a power supply at a voltage level between the reference voltage and a second power-supply voltage, which is higher than the first power-supply voltage, an output PMOS transistor at an input stage of the second circuit group with a gate driven by the first power-supply voltage to deliver an output of the second power-supply voltage; and a level conversion circuit, which is provided as an interface from the first circuit group to the second circuit group, operates by being driven by a power supply at a voltage level between the first power-supply voltage and the second power-supply voltage to control electrical conduction of the output PMOS transistor and has: a first PMOS transistor provided on an electrical path from a line of the first power-supply voltage to a gate of the output PMOS transistor and controlled to enter an electrically conductive state by a first signal supplied by the first circuit group to a gate of the first PMOS transistor; a second PMOS transistor provided on an electrical path from a line of the second power-supply voltage to the gate of the output PMOS transistor and controlled to enter an electrically conductive state by the first power-supply voltage supplied to a gate of the second PMOS transistor; a third PMOS transistor provided on an electrical path from the line of the first power-supply voltage to a gate of the second PMOS transistor and controlled to enter an electrically conductive state by a second signal supplied by the first circuit group to a gate of the third PMOS transistor; and a fourth PMOS transistor provided on an electrical path from the line of the second power-supply voltage to the gate of the second PMOS transistor and controlled to enter an electrically conductive state or an electrically non-conductive state by the first or second power-supply voltage to a gate of the fourth PMOS transistor by way of the first or second PMOS transistor respectively, wherein either the first PMOS transistor or the third PMOS transistor is controlled to enter an electrically conductive state.

In the semiconductor device according to the second aspect of the invention, a first PMOS transistor is put in an electrically conductive state to supply the first power-supply voltage to the gates of an output PMOS transistor and a fourth PMOS transistor, putting the output PMOS transistor and the fourth PMOS transistor in an electrically conductive state. When the fourth PMOS transistor is put in an electrically conductive state, the second power-supply voltage is supplied to the gate of a second PMOS transistor, putting the second PMOS transistor in an electrically non-conductive state. At that time, a third PMOS transistor is put in an electrically non-conductive state. Conversely, when the first PMOS transistor is put in an electrically non-conductive state but the third PMOS transistor is put in an electrically conductive state, the second PMOS transistor is put in an electrically conductive state and the output PMOS transistor and the fourth PMOS transistor are put in an electrically non-conductive state In the above configuration, terminals of the transistors can be connected to each other directly or through circuit components each having a voltage-dropping function as long as a voltage equal to or larger than the threshold voltage of each of the transistors is applied between the gate and source of the transistor when the first power-supply voltage is supplied to the gate of the transistor. Examples of the circuit components are resistors and/or diodes.

In addition, the high level of the first and second signals generated by the first circuit group can be the level of the first power-supply voltage, a voltage raised from the first power-supply voltage or even a voltage further raised from the first power-supply voltage. With the first or second signal set at the high level, the first or third PMOS transistor is put in an electrically non-conductive state.

Thus, since the level conversion circuit has a configuration of supplying the second power-supply voltage relative to the first power-supply voltage instead of being relative to the reference voltage, a difference in supplied voltage is equal to a difference in voltage level between the first power-supply voltage and the second power-supply voltage. Accordingly, the first to fourth PMOS transistors do not have to be transistors each capable of enduring the second power-supply voltage as a withstand voltage. That is, the first to fourth PMOS transistors can each be a circuit component having a lower withstand voltage. In addition, in the conversion of a signal level, it is not necessary to generate an intermediate third power-supply voltage by proportional division of the first power-supply voltage and the second power-supply voltage. Thus, there is no current consumption accompanying the proportional division.

By supplying a voltage equal to or larger than the threshold voltage of a PMOS transistor between the gate and source of the transistor, the transistor can be put in an electrically conductive state. Since the second power-supply voltage is applied to the sources of the output, first and fourth PMOS transistors, by supplying a voltage with voltage drop equal to or larger than the threshold voltage from second power-supply voltage to the gates of the output, first and fourth PMOS transistors, the output, first and fourth PMOS transistors can be controlled to enter an electrically conductive state or an electrically non-conductive state provided that the first power-supply voltage and the second power-supply voltage are set at such values that the difference between the first and second power-supply voltages is equal to or larger than the threshold voltage of the output, first and fourth PMOS transistors. In addition, a circuit for supplying the first power-supply voltage and the second power-supply voltage to the output, second and fourth PMOS transistors can be constructed with ease by employing PMOS transistors suitable for execution of electrical conduction on voltages on the high side. Since such a circuit is composed of PMOS transistors, the level conversion circuit can be built with ease between the first and second power-supply voltages, which are voltages floating with respect to the reference voltage.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Embodiments implementing a semiconductor device provided by the present invention are explained by referring to FIGS. 1 to 14 as follows.

Figure 1:
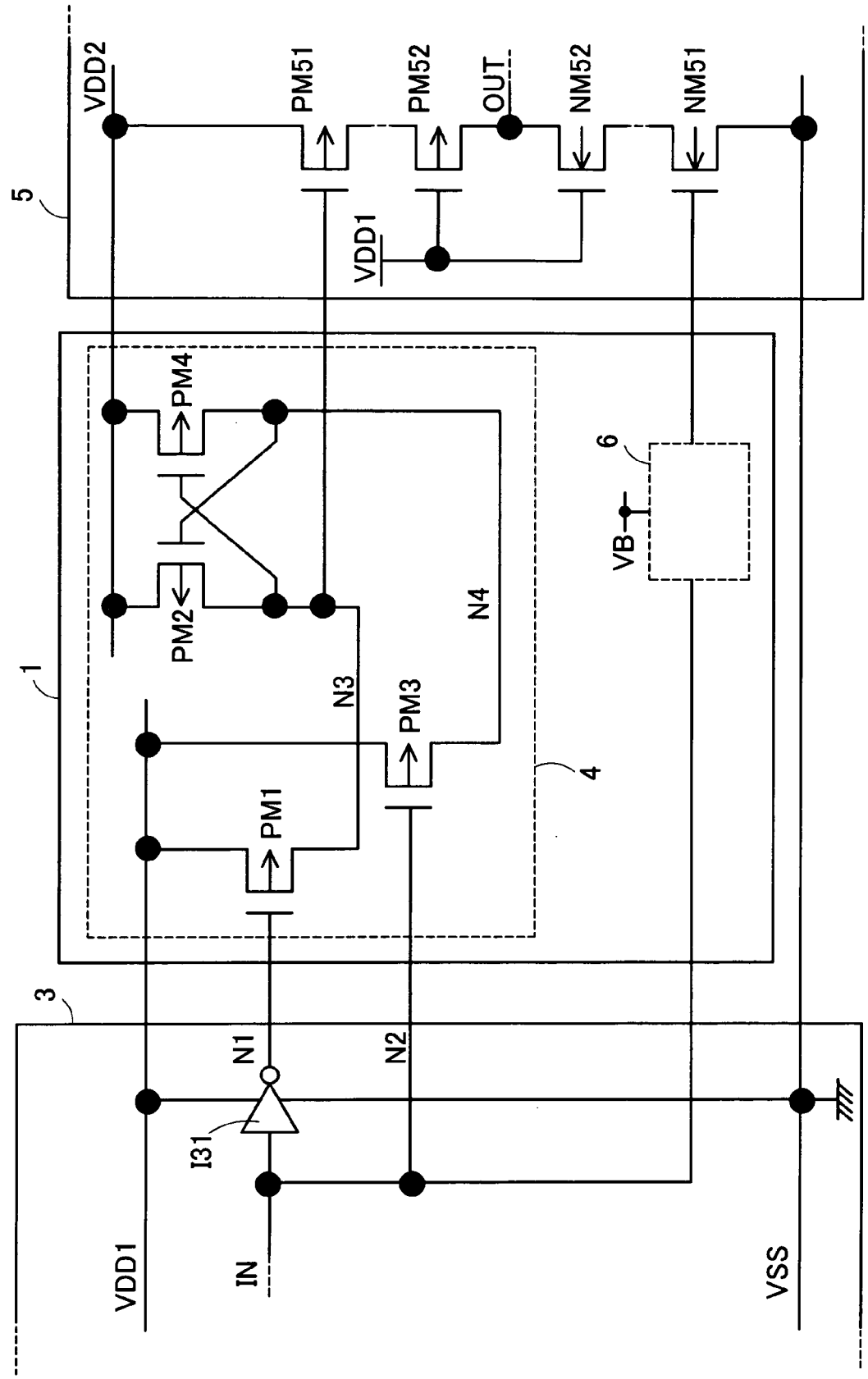
FIG. 1 is a circuit diagram showing a preferred embodiment of the present invention.

FIG. 1 is a circuit diagram showing a preferred embodiment implementing a semiconductor device provided by the present invention. The semiconductor device comprises a first circuit group 3 and a second circuit group 5. The first circuit group 3 is a group of circuits operating by being driven by a first power-supply voltage VDD1 relative to a reference voltage VSS. On the other hand, the second circuit group 5 is a group of circuits operating by being driven by a second power-supply voltage VDD2 relative to the reference voltage VSS. The second power-supply voltage VDD2 has a voltage level higher than the first power-supply voltage VDD1.

The first circuit group 3 is a circuit portion required to have a high processing speed. The first circuit group 3 is a circuit portion suitable for applications to control and processing, which are executed in a field of electronic devices each having an increasing number of functions and a rising processing speed. In general, the first circuit group 3 is implemented by adoption of a process technology in which miniaturization is making progress to increase the number of functions in the first circuit group 3 and raise the processing speed of the first circuit group 3. Thus, an inverter gate I31 serving as a typical device employed in the first circuit group 3 is required to operate at a low voltage. The first power-supply voltage VDD1 is a power-supply voltage satisfying this required specification. At the first power-supply voltage VDD1, which is a low power-supply voltage, the withstand-voltage characteristic of a device employed in the first circuit group 3 can be assured. For the second power-supply voltage VDD2, which is a power-supply voltage higher than the first power-supply voltage VDD1, the withstand-voltage characteristic of a device may not be assured in some cases. In such a case, the second power-supply voltage VDD2 cannot be applied to the device.

The second circuit group 5 is a circuit portion operating at the second power-supply voltage VDD2, which is a higher power-supply voltage. The second circuit group 5 is a control portion of typically an apparatus operating in an existing power-supply voltage system, or the second circuit group 5 is a circuit portion suitable for applications to operations to control and drive typically any one of another device and another apparatus, which operate at a predetermined voltage. These control portion and circuit portion require the second power-supply voltage VDD2 having a voltage level different from the first power-supply voltage VDD1, which is needed to increase the number of functions and raise the processing speed. In addition, the second power-supply voltage VDD2 may have a voltage level higher than the first power-supply voltage VDD1 in some cases.

In the circuit shown in FIG. 1, an input signal IN having an amplitude equal to the first power-supply voltage VDD1 in the first circuit group 3 may in some cases be output as an output signal OUT having an amplitude equal to the second power-supply voltage VDD2 in the second circuit group 5. In this case, the input signal IN supplied to the first circuit group 3 is a signal obtained as a result of an operation such as a control operation or a processing operation. On the other hand, the output signal OUT generated by the second circuit group 5 is output to another device external to the semiconductor device as it is to be used as a signal to drive or control the other device. As an alternative, the output signal OUT is used as an input signal supplied to another second circuit group 5.

The input portion of the second circuit group 5 comprises a switch on the high side and a switch on the low side. The switch on the high side is a PMOS transistor PM51 having its source connected to the line of the second power-supply voltage VDD2. On the other hand, a switch on the low side is an NMOS transistor NM51 having its source connected to the line of the reference voltage VSS. Signals generated by a level conversion circuit 1 to be described later are supplied to the gates of the PMOS transistor PM51 and the NMOS transistor NM51 to execute switching control exclusively from each other. The drain of the PMOS transistor PM51 is connected to the source of a PMOS transistor PM52 and the drain of the PMOS transistor PM52 is connected to the drain of an NMOS transistor NM52. The drain of the NMOS transistor NM51 is connected to the source of the NMOS transistor PM52 and the drain of the NMOS transistor NM52 is connected to the drain of the PMOS transistor PM52. The drains of the PMOS transistor PM52 and the NMOS transistor NM52 are connected to each other at a junction point used as an output terminal OUT. The gates of the PMOS transistor PM52 and the NMOS transistor NM52 are connected to the line of the first power-supply voltage VDD1.

The PMOS transistor PM52 is electrically conductive when the PMOS transistor PM51 is put in an electrically conductive state and the NMOS transistor NM52 is electrically conductive when the NMOS transistor NM51 is put in an electrically conductive state. When the PMOS transistor PM51 and the PMOS transistor PM52 are put in an electrically conductive state, the second power-supply voltage VDD2 is applied to the drain of the NMOS transistor NM52, which thereby enters an electrically non-conductive state, establishing a bias state of a saturation characteristic. By the same token, when the NMOS transistor NM51 and the NMOS transistor NM52 are put in an electrically conductive state, the reference voltage VSS is applied to the drain of the PMOS transistor PM52, which thereby enters an electrically non-conductive state, establishing a bias state of a saturation characteristic. Thus, a voltage lower than the first power-supply voltage VDD1 by a difference equal to the threshold voltage of the NMOS transistor NM52 is applied to the drain of the NMOS transistor NM51, and a voltage higher than the first power-supply voltage VDD1 by a difference equal to the threshold voltage of the PMOS transistor PM52 is applied to the drain of the PMOS transistor PM51. As a result, also in the second circuit group 5 to which the second power-supply voltage VDD2 relative to the reference voltage VSS is applied, only a difference in voltage level between the second power-supply voltage VDD2 and the first power-supply voltage VDD1 is applied to the PMOS transistor PM51 and the PMOS transistor PM52 whereas only a voltage equal to the first power-supply voltage VDD1 is applied to the NMOS transistor NM51 and the NMOS transistor NM52.

For the above reason, the second circuit group 5 to which the second power-supply voltage VDD2 having a high voltage level is applied can be constructed from transistors each having a characteristic of a low withstand voltage.

It is to be noted that, while this embodiment comprises the PMOS transistor PM52 and the NMOS transistor NM52 by one stage as transistors each used for assuring a withstand-voltage characteristic, another embodiment can also be designed from two or more stages. In this case, it is desirable to provide a configuration for shifting an applied voltage stage by stage by properly adjusting a voltage applied to the gate of every MOS transistor. By providing a multi-stage configuration, a circuit configuration can be constructed from transistors each having a characteristic of low withstand voltage even for a case in which the second power-supply voltage VDD2 having an even higher voltage level is supplied.

The level conversion circuit 1 mentioned above is a circuit provided between the first circuit group 3 and the second circuit group 5 as a circuit for converting the level of a signal from the first power-supply voltage VDD1 to the second power-supply voltage VDD2.

The level conversion circuit 1 includes a high-side level conversion circuit 4 comprising PMOS transistors PM1 to PM4. The high-side level conversion circuit 4 is a circuit for driving the gate of the PMOS transistor PM51 serving as a switch on the high side as described above. The sources of the PMOS transistors PM1 and PM3 are connected to a line of the first power-supply voltage VDD1 whereas the sources of the PMOS transistors PM2 and PM4 are connected to a line of the second power-supply voltage VDD2. The gate of the PMOS transistor PM4 is connected to the drains of the PMOS transistors PM1 and PM2 as well as the gate of the PMOS transistor PM51 at a node N3. On the other hand, the gate of the PMOS transistor PM2 is connected to the drains of the PMOS transistors PM3 and PM4 at a node N4. The gate of the PMOS transistor PM1 is connected to the output terminal of the inverter gate I31 at a node N1. The gate of the PMOS transistor PM3 is connected to a node N2 to which the input signal IN is supplied.

It is to be noted that a signal for driving and controlling the gate of the NMOS transistor NM51 on the low side is a signal having a voltage level converted from the voltage level of the input signal IN. This signal is generated from a low-side level conversion circuit 6 to be described later by referring to FIG. 14.

When the input signal IN is a high-level signal having the voltage level of the first power-supply voltage VDD1, a signal output by the inverter gate I31 as a signal appearing at the node N1 is a low-level signal having the voltage level of the reference voltage VSS. In this case, since the input signal IN is supplied to the node N2 connected to the gate of the PMOS transistor PM3, the first power-supply voltage VDD1 is supplied to the gate of the PMOS transistor PM3. At that time, since the gate of the PMOS transistor PM1 is wired to the node N1, the reference voltage VSS is supplied to the gate of the PMOS transistor PM1. Since the source of the PMOS transistor PM1 is connected to the line of the first power-supply voltage VDD1, the PMOS transistor PM1 is put in an electrically conductive state.

With the PMOS transistor PM1 put in an electrically conductive state, the first power-supply voltage VDD1 is supplied to the node N3, which is wired to the drain of the PMOS transistor PM1. Accordingly, the first power-supply voltage VDD1 is supplied to the gates of the PMOS transistor PM4 and the PMOS transistor PM51. Since the sources of the PMOS transistor PM4 and the PMOS transistor PM51 are connected to the line of the second power-supply voltage VDD2, a difference in voltage level between the first power-supply voltage VDD1 and the second power-supply voltage VDD2 is applied between the gate and source of the PMOS transistor PM4 as well as the gate and source of the PMOS transistor PM51. Thus, the PMOS transistor PM4 is put in an electrically conductive state provided that the difference in voltage level between the first power-supply voltage VDD1 and the second power-supply voltage VDD2 is at least equal to the threshold voltage of the PMOS transistor PM4. By the same token, the PMOS transistor PM51 is put in an electrically conductive state provided that the difference in voltage level between the first power-supply voltage VDD1 and the second power-supply voltage VDD2 is at least equal to the threshold voltage of the PMOS transistor PM51.

With the PMOS transistor PM4 put in an electrically conductive state, the second power-supply voltage VDD2 is supplied to the node N4, which is wired to the drain of the PMOS transistor PM4. Accordingly, the PMOS transistor PM2 is put in an electrically non-conductive state. Thus, the node N3 receiving the first power-supply voltage VDD1 through the PMOS transistor PM1 is not connected to the line of the second power-supply voltage VDD2. Since the gate of the PMOS transistor PM3 is wired to the node N2, the first power-supply voltage VDD1 (the input signal IN) is supplied to the gate of the PMOS transistor PM3 but, since the drain of the PMOS transistor PM3 is wired to the node N4, on the other hand, the second power-supply voltage VDD2 is supplied to the drain of the PMOS transistor PM3. Thus, a difference in voltage level between the first power-supply voltage VDD1 and the second power-supply voltage VDD2 is applied between the gate and drain of the PMOS transistor PM3. As a result, the PMOS transistor PM3 is put in an electrically non-conductive state provided that the difference in voltage level between the first power-supply voltage VDD1 and the second power-supply voltage VDD2 is small in comparison with the threshold voltage of the PMOS transistor PM3. Thus, the node N4 receiving the second power-supply voltage VDD2 through the PMOS transistor PM4 is not connected to the line of the first power-supply voltage VDD1.

When the input signal IN is a low-level signal having the voltage level of the reference voltage VSS, on the other hand, operating states opposite to what are described above prevail since the levels of the applied voltages are inverted.

That is, the reference voltage VSS is applied to the gate of the PMOS transistor PM3, causing the PMOS transistor PM3 to enter an electrically conductive state. Thus, the first power-supply voltage VDD1 is applied to the gate of the PMOS transistor PM2, causing the PMOS transistor PM2 to enter an electrically conductive state. Assume that the difference in voltage level between the first power-supply voltage VDD1 and the second power-supply voltage VDD2 is at least equal to the threshold voltage of the PMOS transistor PM2. In this case, since the second power-supply voltage VDD2 is supplied to the node N3, the PMOS transistor PM4 and the PMOS transistor PM51 are put in an electrically non-conductive state. Thus, the second power-supply voltage VDD2 is supplied to neither the output terminal OUT nor the node N4, which is receiving the first power-supply voltage VDD1 through the PMOS transistor PM3.

Even though the difference in voltage level between the first power-supply voltage VDD1 and the second power-supply voltage VDD2 is applied between the gate and drain of the PMOS transistor PM1, the PMOS transistor PM1 is put in an electrically non-conductive state provided that the difference in voltage level between the first power-supply voltage VDD1 and the second power-supply voltage VDD2 is small in comparison with the threshold voltage of the PMOS transistor PM1. Thus, the first power-supply voltage VDD1 is not supplied to the node N3, which is receiving the second power-supply voltage VDD2 through the PMOS transistor PM2.

Figure 14:
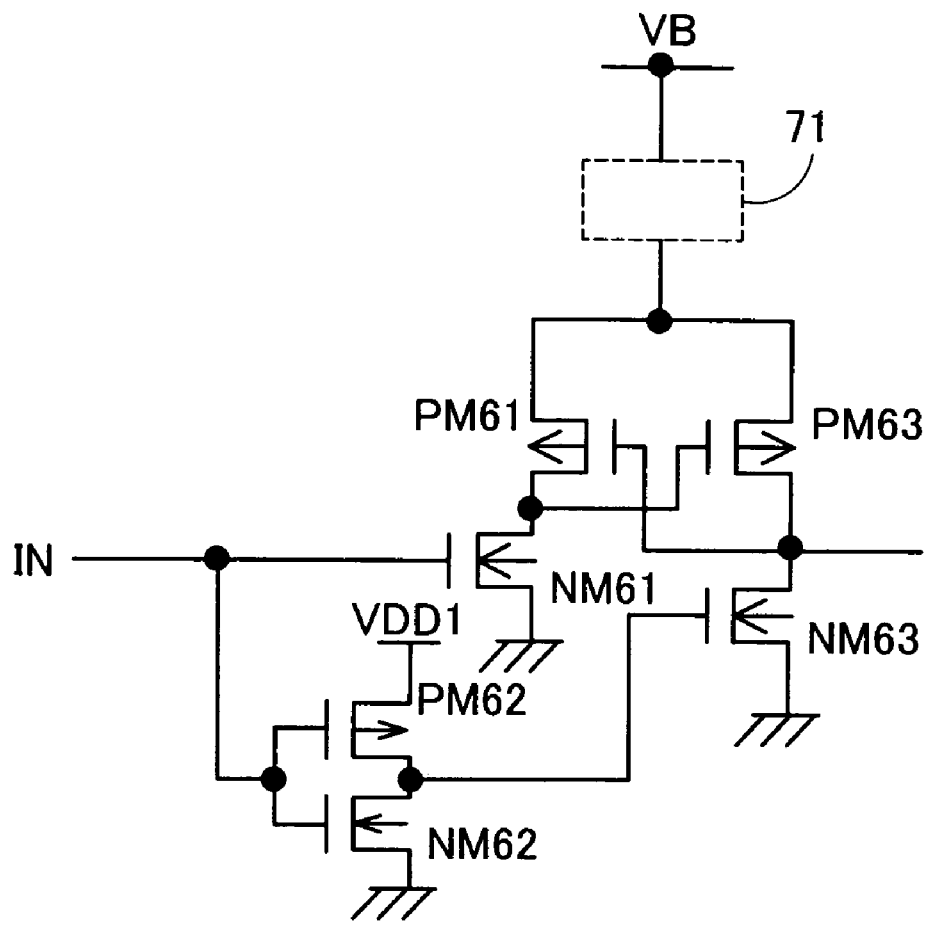
FIG. 14 is a circuit diagram showing a low-side level conversion circuit for driving an NMOS transistor NM51 as one of level conversion circuits implemented by embodiments.
Figure 15:
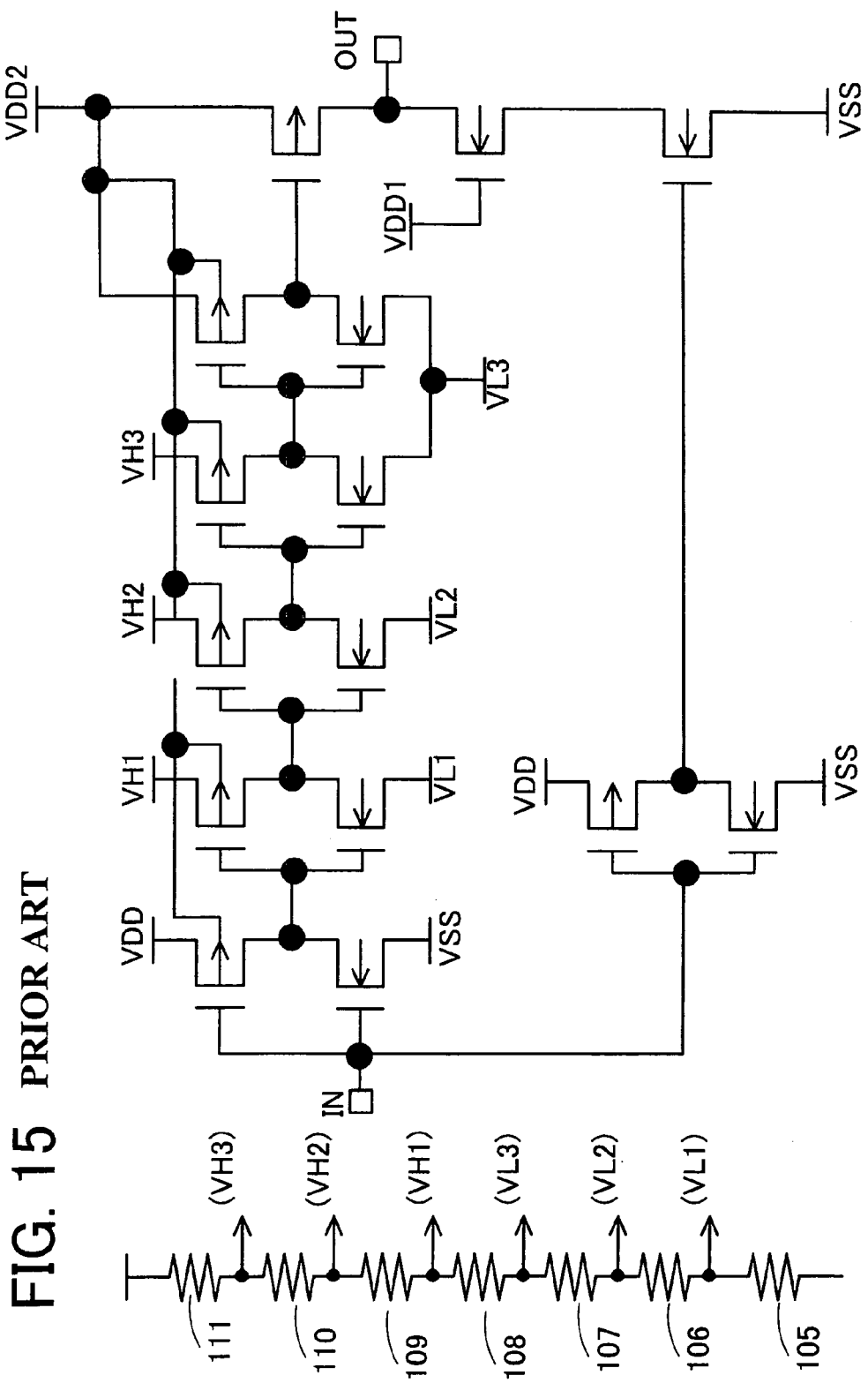
FIG. 15 is a circuit diagram showing a level conversion circuit based on the conventional technology.

On the other hand, a signal generated by a low-side level conversion circuit 6 to be described later by referring to FIG. 14 is supplied to the gate of the NMOS transistor NM51 as described above. Since the supplied signal has the same phase as the input signal IN, control of electrical conduction is executed exclusively from the PMOS transistor PM 51.

When the PMOS transistor PM51 is put in an electrically conductive state, the second power-supply voltage VDD2 is supplied to the drain of the PMOS transistor PM51 connected to the source of the PMOS transistor PM52. When the PMOS transistor PM52 has the same threshold voltage as the PMOS transistor PM51, the PMOS transistor PM52 is also put in an electrically conductive state, supplying the second power-supply voltage VDD2 to the output terminal OUT. Since the NMOS transistor NM52 is in an electrically non-conductive state, the output signal OUT appearing at the output terminal OUT is a signal having the voltage level of the second power-supply voltage VDD2.

When the PMOS transistor PM51 is in an electrically non-conductive state, on the other hand, the NMOS transistor NM51 is put in an electrically conductive state, connecting its drain to the reference voltage VSS. At that time, the NMOS transistor NM52 is also put in an electrically conductive state, supplying the reference voltage VSS to the output terminal OUT. The output signal OUT appearing at the output terminal OUT is a signal having the voltage level of the reference voltage VSS.

In accordance with the high-side level conversion circuit 4 employed in the level conversion circuit 1, since the difference in voltage level between the first power-supply voltage VDD1 and the second power-supply voltage VDD2 is at least equal to the threshold voltage of the PMOS transistor PM2, PM4, PM51 and PM52, the PMOS transistor PM2, PM4, PM51 and PM52 can be put in an electrically conductive state or electrically non-conductive state by controlling the gates of the PMOS transistor PM2, PM4, PM51 and PM52 by using the first power-supply voltage VDD1 and the second power-supply voltage VDD2. The high-side level conversion circuit 4 can be constructed from PMOS transistors with ease.

In converting the input signal IN with an amplitude varying between the reference voltage VSS and the first power-supply voltage VDD1 into a signal with an amplitude varying between the first power-supply voltage VDD1 and the second power-supply voltage VDD2 for the purpose of controlling the electrical conduction of the PMOS transistor PM51, no steady current electrical path from the line of the second power-supply voltage VDD2 to the line of the first power-supply voltage VDD1 is created. In addition, a third power-supply voltage having a voltage level between the first power-supply voltage VDD1 and the second power-supply voltage VDD2 is also not required. Thus, steady current consumption due to voltage division of the first power-supply voltage VDD1 and the second power-supply voltage VDD2 does not occur either.

Moreover, since circuits is constructed between the first power-supply voltage VDD1 and the second power-supply voltage VDD2 in place of the reference voltage VSS, a difference in voltage level applied to the transistors is a difference in voltage level between the first power-supply voltage VDD1 and the second power-supply voltage VDD2. The PMOS transistor PM1 to the PMOS transistor PM4 serving as first to fourth PMOS transistors respectively are not required to withstand the second power-supply voltage VDD2. Instead, the PMOS transistors PM1 to PM4 can each be a transistor having a low withstand voltage.

Furthermore, at the input stage of the second circuit group 5, for the PMOS transistor PM51, the PMOS transistor PM52 is used as a transistor for assuring a withstand-voltage characteristic and, for the NMOS transistor NM51, the NMOS transistor NM52 is used as a transistor for assuring a withstand-voltage characteristic. Only a difference in voltage level between the second power-supply voltage VDD2 and the first power-supply voltage VDD1 is applied to the PMOS transistor PM51 and the PMOS transistor PM52 whereas only a voltage equal to the first power-supply voltage VDD1 is applied to the NMOS transistor NM51 and the NMOS transistor NM52. Thus, the second circuit group 5 can be constructed from transistors each having a low withstand voltage characteristic.

These MOS transistors each having a low withstand voltage each have a gate oxide film with a small thickness providing a high circuit operation speed.

With the PMOS transistor PM2 put in an electrically conductive state allowing the second power-supply voltage VDD2 to be supplied to the node N3, the electrical path from the node N3 to the line of the first power-supply voltage VDD1 must be cut off by the PMOS transistor PM1. By the same token, with the PMOS transistor PM4 put in an electrically conductive state allowing the second power-supply voltage VDD2 to be supplied to the node N4, the electrical path from the node N4 to the line of the first power-supply voltage VDD1 must be cut off by the PMOS transistor PM3. These electrical paths are cut off by taking any of the following four methods.

Figure 2:
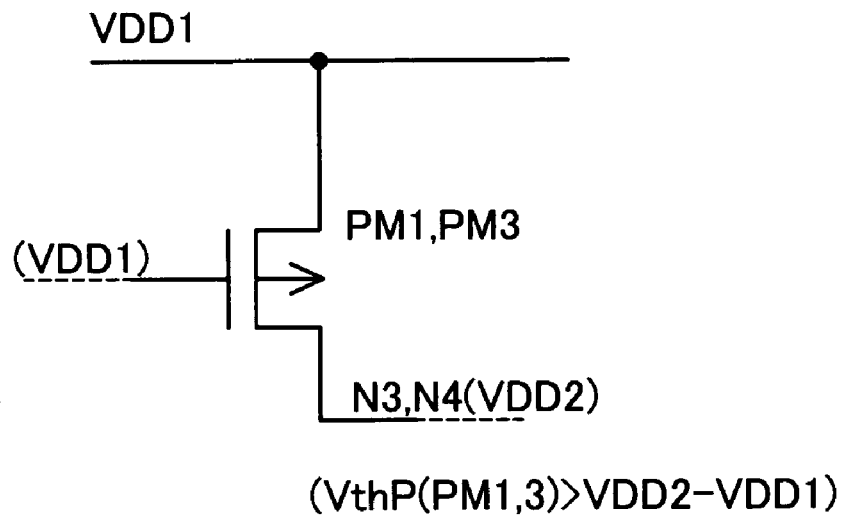
FIG. 2 is a circuit diagram showing a first method for preventing PMOS transistors employed in a level conversion circuit from incorrectly entering an electrically conductive state.

FIG. 2 is a diagram showing the first method. In accordance with this method, the PMOS transistors PM1 and PM3 are each designed into a configuration different from those of the PMOS transistors PM2, PM4, PM51 and PM52. In general, the PMOS transistor PM1 or PM3 is controlled to an electrically non-conductive state by applying the first power-supply voltage VDD1 by a signal generated by the first circuit group 3 to its gate. In order to cut off the second power-supply voltage VDD2 applied to the drain of the PMOS transistors PM1 and PM3, it is necessary to take a threshold voltage deeper than the difference between the first power-supply voltage VDD1 and the second power-supply voltage VDD2 as the threshold voltage of the PMOS transistor PM1 or PM3. As substitutes for the PMOS transistors PM2, PM4, PM51 and PM52, it is preferable to employ transistors each having a deeper threshold voltage.

Figure 3:
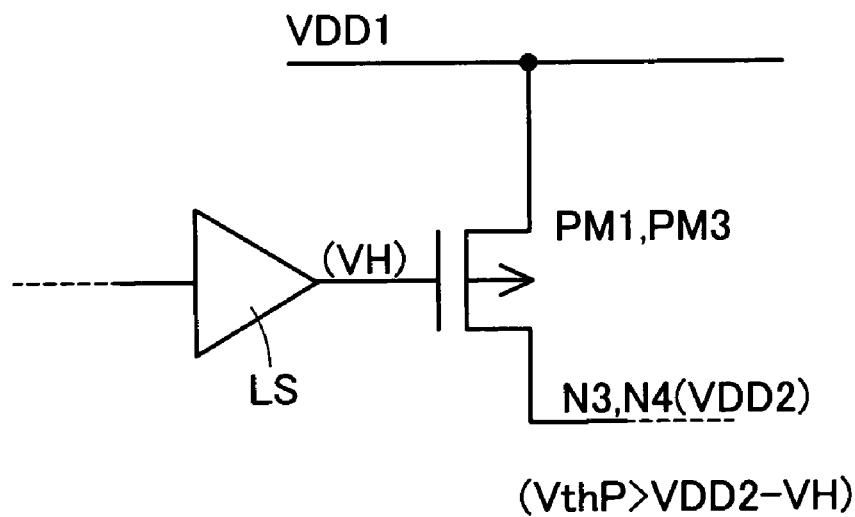
FIG. 3 is a circuit diagram showing a second method for preventing the PMOS transistor employed in the level conversion circuit from incorrectly entering an electrically conductive state.

FIG. 3 is a diagram showing the second method. In accordance with this method, the PMOS transistors PM1 and PM3 are each designed into a configuration identical with those of the PMOS transistors PM2, PM4, PM51 and PM52. A voltage-level conversion circuit LS for converting a voltage level is connected to the nodes N1 and N2, which are wired to the gates of the PMOS transistors PM1 and PM3 respectively. That is, a signal generated by the first circuit group 3 is supplied to the gate of the PMOS transistor PM1 or PM3 by way of the voltage-level conversion circuit LS. The PMOS transistor PM1 or PM3 is controlled to an electrically non-conductive state by supplying a signal having a voltage level VH higher than the first power-supply voltage VDD1. When the voltage-level conversion circuit LS is so set that a difference in voltage level between the first power-supply voltage VDD1 and the voltage level VH generated by the voltage-level conversion circuit LS is small in comparison with the threshold voltage of the PMOS transistor PM1 or PM3, the PMOS transistor PM1 or PM3 can be sustain in an electrically non-conductive state when the second power-supply voltage VDD2 is being supplied to the drain of the PMOS transistor PM1 or PM3 respectively.

Figure 4:
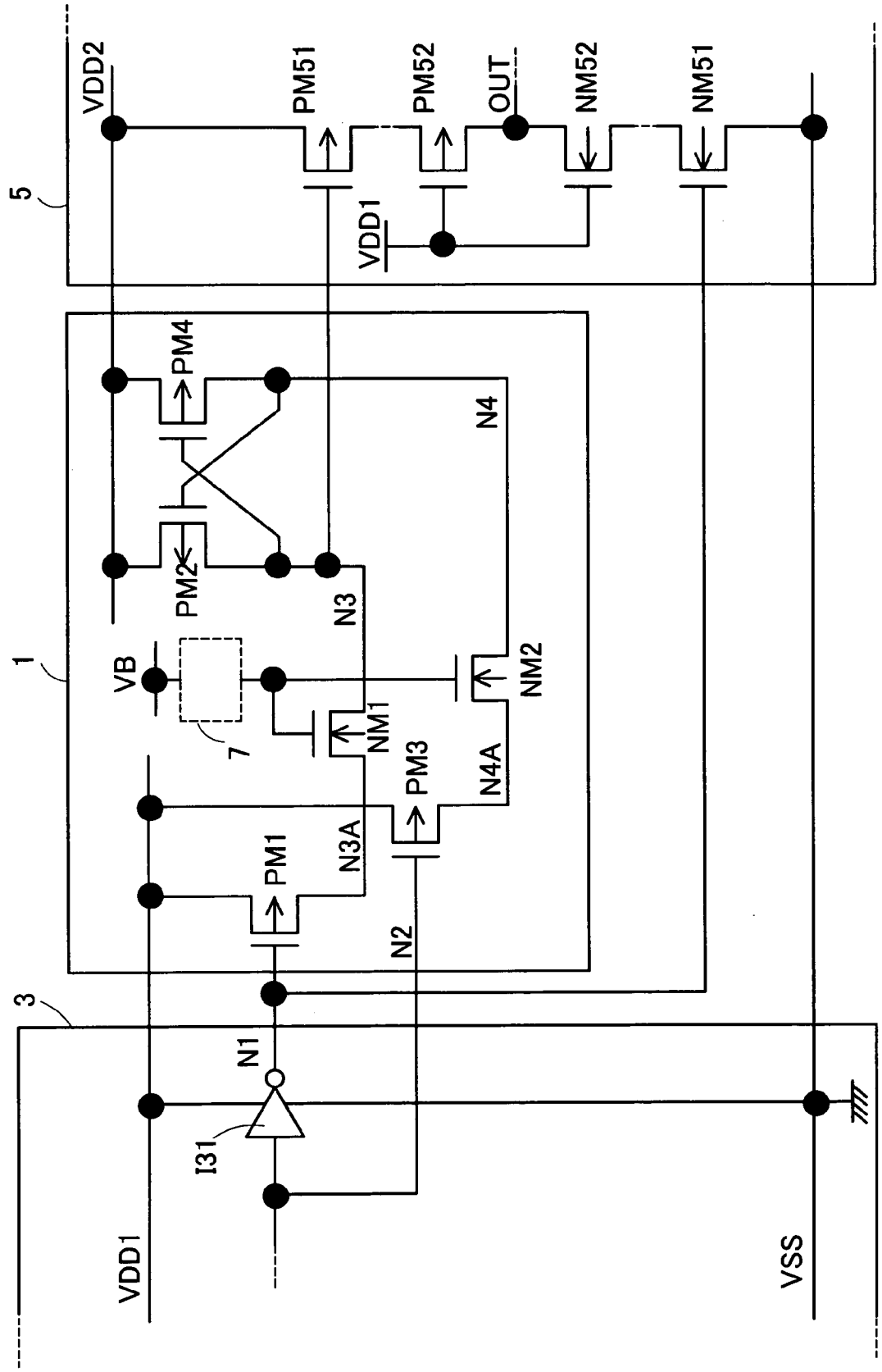
FIG. 4 is a circuit diagram showing a third method for preventing the PMOS transistor employed in the level conversion circuit from incorrectly entering an electrically conductive state.

FIG. 4 is a diagram showing the third method. In accordance with this third method, an NMOS transistor NM1 is provided between the PMOS transistors PM1 and PM2 whereas an NMOS transistor NM2 is provided between the PMOS transistors PM3 and PM4. The drain of the PMOS transistor PM1 is connected to the source of the NMOS transistor NM1 at a node 3A whereas the drain of the PMOS transistor PM3 is connected to the source of the NMOS transistor NM2 at a node 4A. On the other hand, the drain of the PMOS transistor PM2 is connected to the drain of the NMOS transistor NM1 at the node 3 whereas the drain of the PMOS transistor PM4 is connected to the drain of the NMOS transistor NM2 at the node 4. A predetermined common bias voltage VG is supplied to the gates of both the NMOS transistors NM1 and NM2. Instead of supplying the gate bias voltage VB to the gates directly, a bias voltage VB can also be supplied to the gates by way of a voltage-drop unit 7.

Figure 5:
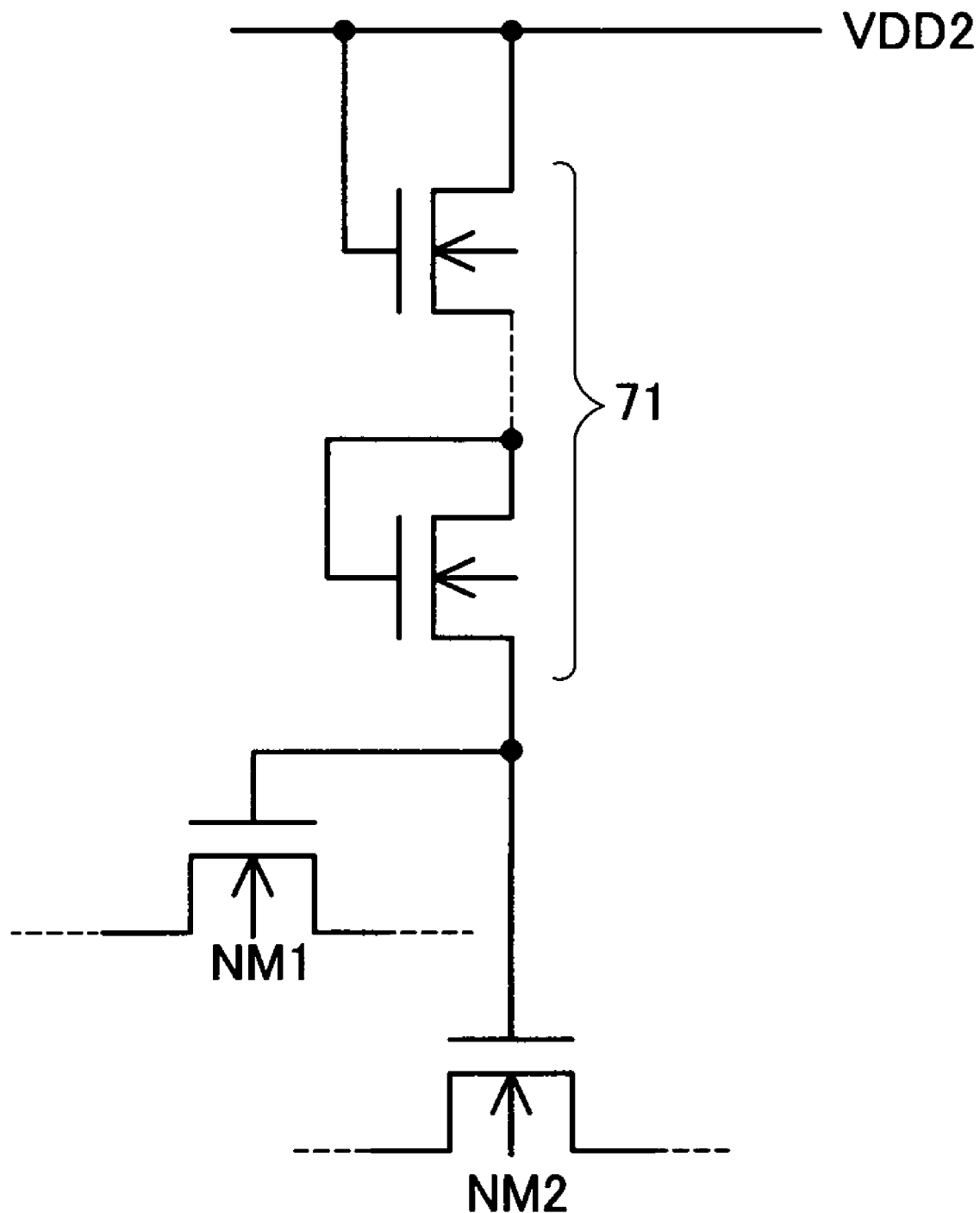
FIG. 5 is a diagram showing a concrete typical embodiment of the third method shown in FIG. 4.

The voltage-drop unit 7 can have a configuration like one shown in FIG. 5. As shown in the figure, a voltage-drop unit 71 is provided between the second power-supply voltage VDD2 and the gates of the NMOS transistors NM1 and NM2. The voltage-drop unit 71 comprises diode-connected NMOS transistors provided at a predetermined number of stages. The voltage-drop unit 71 causes a voltage drop VDN, by which the second power-supply voltage VDD2 is reduced before being supplied to the gates as the gate bias voltage VG (=VDD−VDN). The voltage-drop unit 7 is not limited to the configuration employing the voltage-drop unit 71. Instead, the voltage-drop unit 7 can comprise any elements such as junction diodes and resistors as long as the elements serve as a means for causing a voltage drop or voltage division.

Refer back to FIG. 4. Concrete operations according to the third method are explained as follows. With the PMOS transistor PM1 put in an electrically conductive state, the first power-supply voltage VDD1 is supplied to the node 3A. At that time, the difference between the first power-supply voltage VDD1 and the gate voltage VG applied to the gate of the NMOS transistor NM1 must be at least equal to the threshold voltage VthN1 of the NMOS transistor NM1, that is, (VG−VDD1)≧VthN1 in order to put the NMOS transistor NM1 in an electrically conductive state. With the NMOS transistor NM1 put in an electrically conductive state, the first power-supply voltage VDD1 is supplied to the node N3, causing the PMOS transistors PM4 and PM51 to enter an electrically conductive state.

With the PMOS transistor PM1 put in an electrically non-conductive state, on the other hand, the second power-supply voltage VDD2 is supplied to the node 3 by way of the PMOS transistor PM2. At that time, the NMOS transistor NM1 operates in a saturated region. A voltage obtained as a result of subtracting the threshold voltage VthN1 from the bias voltage VG applied to the gate of the NMOS transistor NM1, that is, a voltage equal to (VG−VthN1), is supplied to the node 3A. In order to sustain the PMOS transistor PM1 in the electrically non-conductive state, the difference in voltage level between the gate voltage (VG−VthN1) supplied to the node 3A and the first power-supply voltage VDD1 supplied to the node N1 wired to the gate of the PMOS transistor PM1 must be equal to or smaller than the threshold voltage VthP1 of the PMOS transistor PM1. That is, in order to sustain the PMOS transistor PM1 in the electrically non-conductive state, the following relation must be satisfied:

$$(VG-VthN1)-VDD1<VthP1$$

The PMOS transistor PM3 and the NMOS transistor NM2 operate in similar ways.

In accordance with the third method shown in FIG. 4, $$VthN1 \leq VG-VDD1<VthP1+VthN1 \quad (1)$$

When a condition expressed by relations (VthN2≦VG−VDD1<VthP3+VthN2) is satisfied, the electrical conduction and non-conduction of the PMOS transistors PM1 and PM3 can be controlled. Equation (1) given above is set for the second power-supply voltage VDD2 used as the bias voltage VB. When the second power-supply voltage VDD2 is supplied directly to the gates of the NMOS transistors NM1 and NM2 as the gate voltage VG, that is, for VG=VDD2, Equation (1) is rewritten into the following relation:

$$VthN1 \leq VDD2-VDD1<VthP1+VthN1$$

When the second power-supply voltage VDD2 is reduced by the voltage drop VDN through the voltage-drop unit 71 before being supplied to the gates as the gate bias voltage VG (=VDD2−VDN), Equation (1) is rewritten into the following relation:

$$VthN1+VDN \leq VDD2-VDD1 < VthP1+VthN1+VDN$$

In addition, when a voltage generator other than the generators of the first power-supply voltage VDD1 and the second power-supply voltage VDD2 is available, the use of the other voltage generator for generating the gate voltage VG is conceivable.

In this case, when the gate voltage VG can be set at a lower level by using the voltage-drop unit 71 or the other voltage generator, NMOS transistors each having a lower threshold voltage VthN1 can be employed. Thus, the number of types of transistors usable as the NMOS transistors NM1 and NM2 can be increased.

With the PMOS transistor PM1 or PM3 put in an electrically conductive state, a voltage lower than the first power-supply voltage VDD1 is supplied to the PMOS transistor PM1 or PM3 respectively. Thus, even in the case of a configuration comprising the PMOS transistors PM1 and PM3 each having the same threshold voltage as those of the PMOS transistors PM2, PM4 and PM51, the PMOS transistor PM1 or PM3 can be controlled to enter an electrically non-conductive state.

In addition, in the case of any one of the first to third methods, the PMOS transistor PM1 or PM3 can be controlled to enter an electrically non-conductive state with ease provided that the PMOS transistors PM1 and PM3 are each configured to have a threshold voltage deeper than those of the PMOS transistors PM2, PM4 and PM51. In the case of the method utilizing the NMOS transistors NM1 and NM2, in particular, the range of the bias voltage VB can be broadened.

Figure 6:
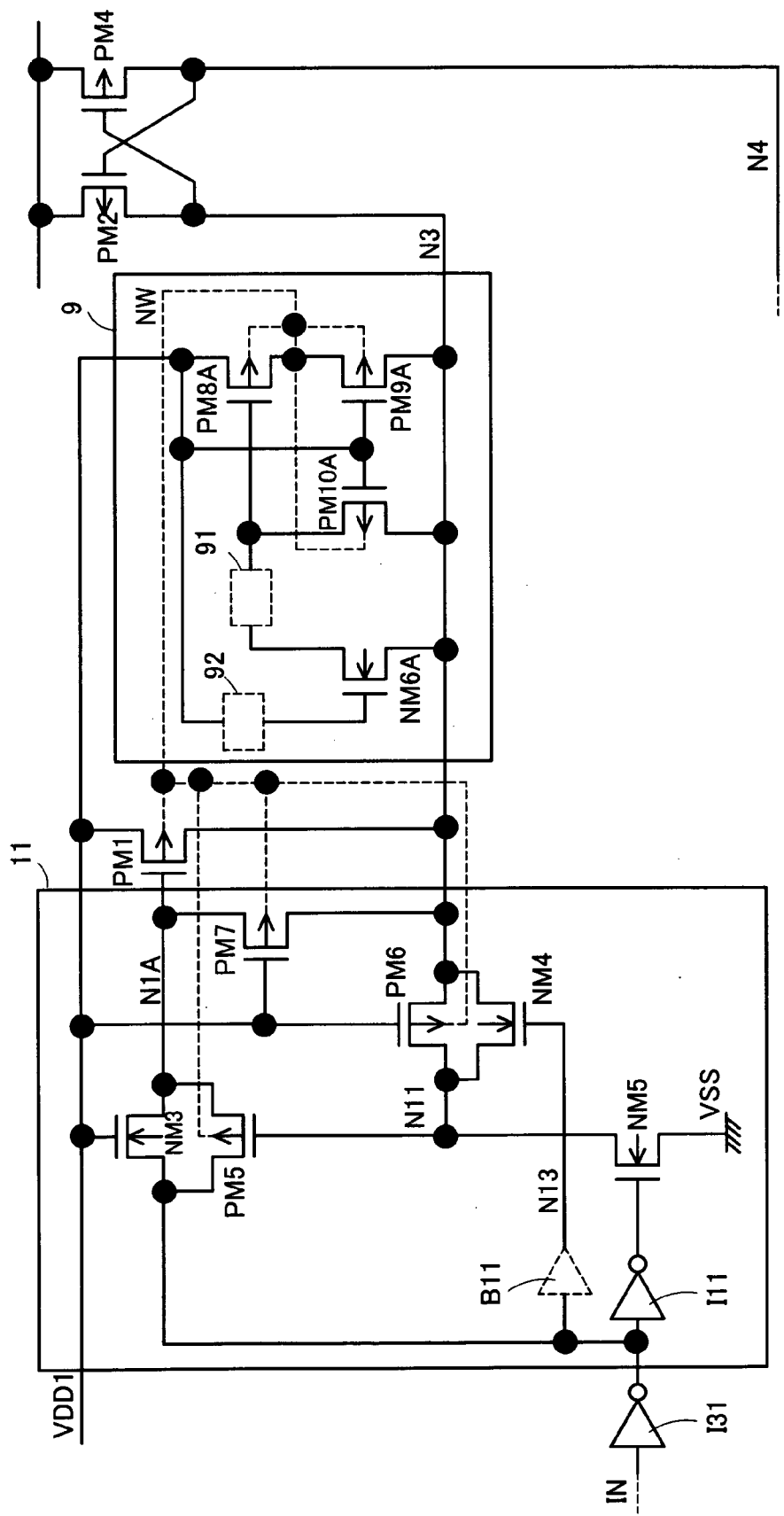
FIG. 6 is a circuit diagram showing a fourth method for preventing the PMOS transistor employed in the level conversion circuit from incorrectly entering an electrically conductive state.

FIG. 6 is a diagram showing the fourth method. In a configuration for taking this fourth method, in accordance with the voltages supplied to the drains of the PMOS transistors PM1 and PM3, the voltages supplied to the gates of the PMOS transistors PM1 and PM3 are controlled. In addition, N-well electric potential is also adjusted as well. The PMOS transistors PM1 and PM3 can have circuit configurations similar to each other. The operation of the PMOS transistor PM1 is explained as an example as follows.

First of all, a gate voltage control unit 11 shown in FIG. 6 is described. A PMOS transistor PM7 is connected between a node N1A wired to the gate of the PMOS transistor PM1 and the node N3 wired to the drain of the PMOS transistor PM1. The gate of the PMOS transistor PM7 is connected to the line of the first power-supply voltage VDD1. When the second power-supply voltage VDD2 is higher that the first power-supply voltage VDD1 by a difference in voltage level at least equal to the threshold voltage of the PMOS transistor PM1, the PMOS transistor PM1 can be sustained in an electrically non-conductive state by supplying the second power-supply voltage VDD2 to the node N1A, which is wired to the gate of the PMOS transistor PM1.

The signal generated by the first circuit group is supplied to the node N1A wired to the gate of the PMOS transistor PM1 by way of a PMOS transistor PM5 or an NMOS transistor NM3. The gate of the NMOS transistor NM3 is connected to the line of the first power-supply voltage VDD1. A node N11 wired to the gate of the PMOS transistor PM5 is connected to the node N3 wired to the drain of the PMOS transistor PM1 through a PMOS transistor PM6 and an NMOS transistor NM4. The gate of the PMOS transistor PM6 is connected to the line of the first power-supply voltage VDD1. A signal generated by the first circuit group or a signal having the same phase as the signal generated by the first circuit group is supplied to the gate of the NMOS transistor NM4.

In this configuration, as a signal generated by the first circuit group, a signal set at the high level of the first power-supply voltage VDD1 is supplied to a node N13, which is wired to the gate of the NMOS transistor NM4. As another conceivable alternative, this signal is supplied to the node N13 after its voltage is reduced by a voltage-drop circuit B11.

A node N11 wired to the gate of the PMOS transistor PM5 is connected to the line of the reference voltage VSS through the NMOS transistor NM5. The signal generated by the first circuit group is supplied to the gate of the NMOS transistor NM5 after being inverted by an inverter gate I11.

With the signal from the first circuit group set at a low level, the signal needs to be supplied to the node N1A, which is wired to the gate of the PMOS transistor PM1, by way of the PMOS transistor PM5 and the NMOS transistor NM3. Since the gate of the NMOS transistor NM3 is connected to the line of the first power-supply voltage VDD1, the NMOS transistor NM3 will be put in an electrically conductive state when voltage level of the signal is lower than the first power-supply voltage VDD1 by at least the threshold voltage of the NMOS transistor NM3.

On the other hand, the gate of the PMOS transistor PM5 is connected to the node N3 through the PMOS transistor PM6 and the NMOS transistor NM4. Since a signal set at a low level is supplied to the gate of the NMOS transistor NM4, the NMOS transistor NM4 is put in an electrically non-conductive state. The PMOS transistor PM6 is also put in an electrically non-conductive state as well. This is because the gate of the PMOS transistor PM6 is connected to the line of the first power-supply voltage VDD1 and the node N3 is brought to the first power-supply voltage VDD1 due to electrical conduction of the PMOS transistor PM1. Thus, an electrical path leading to the node N3 is cut off. Since an inverted high-level signal is supplied to the gate of the NMOS transistor NM5, on the other hand, the NMOS transistor NM5 is put in an electrically conductive state. Thus, the PMOS transistor PM5 is also put in an electrically conductive state as well. As a result, a signal set at a low level is supplied to the node N1A so that the PMOS transistor PM1 is put in an electrically conductive state.

When the signal generated by the first circuit group is set at a high level, the level of the voltage appearing at the node N3 rises to the second power-supply voltage VDD2 due to electrical conduction of the PMOS transistor PM2.

Figure 7:
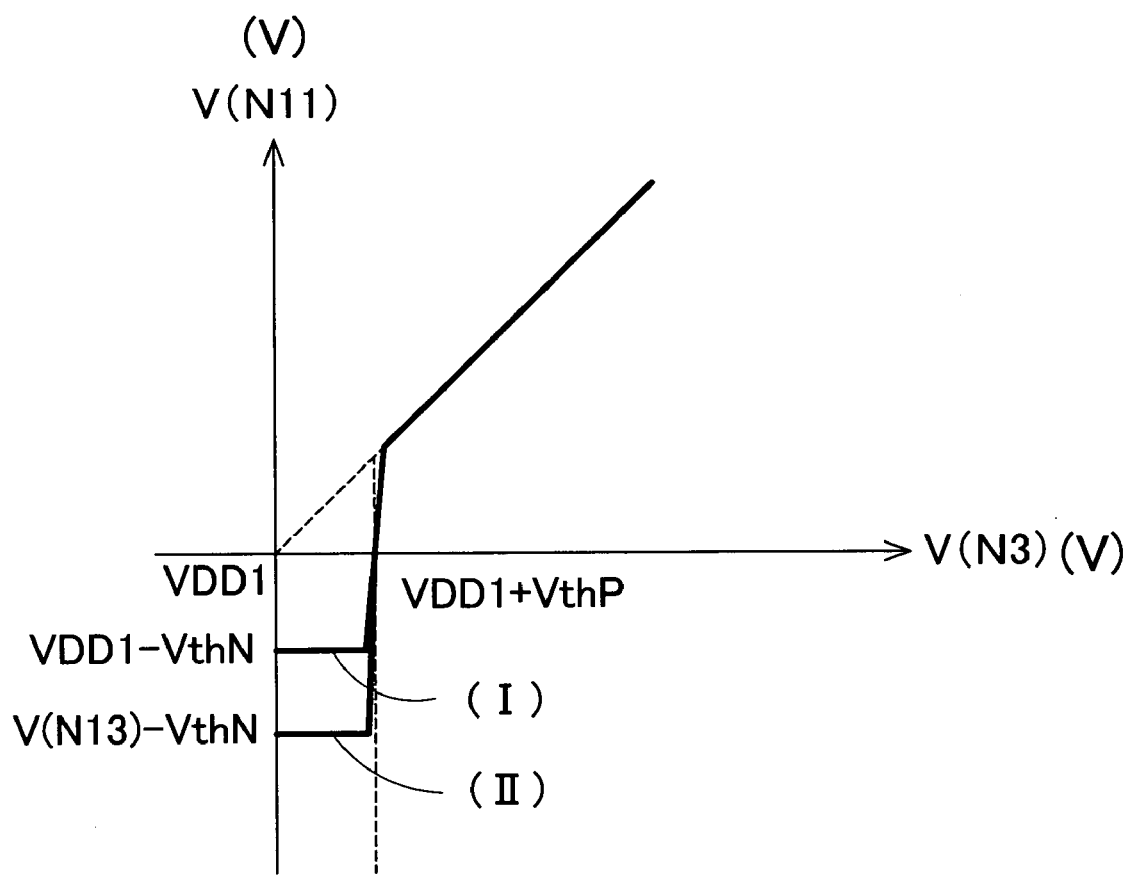
FIG. 7 is a diagram showing a characteristic of a voltage appearing at the gate of a PMOS transistor PM5 subjected to the fourth method.
Figure 8:
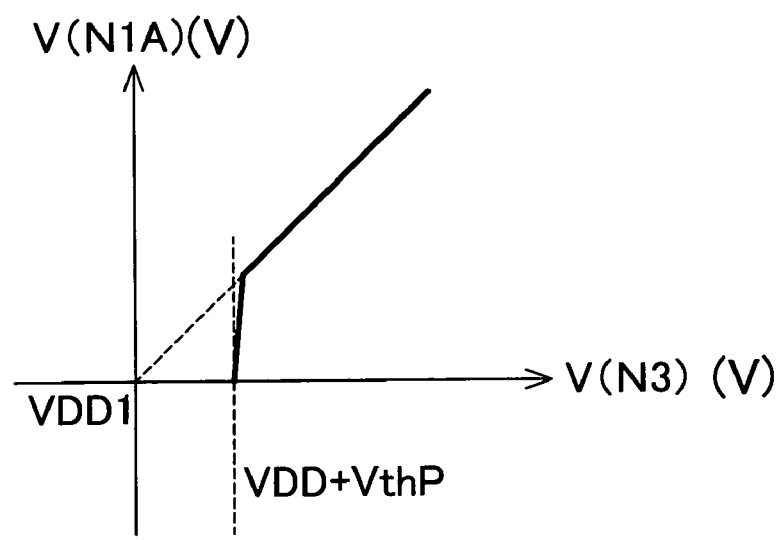
FIG. 8 is a diagram showing a characteristic of a voltage appearing at the gate of a PMOS transistor PM1 subjected to the fourth method.

FIG. 7 is a diagram showing a relation between the level of the second power-supply voltage VDD2 supplied to the node N3 and the level of a voltage appearing at the node N11. On the other hand, FIG. 8 is a diagram showing a relation between the level of the second power-supply voltage VDD2 supplied to the node N3 and the level of a voltage appearing at the node N1A. In this case, the NMOS transistor NM5 is put in an electrically non-conductive state since a voltage set at a low level is supplied to the gate of the NMOS transistor NM5. The PMOS transistors PM1, PM6 and PM7 are assumed to have equal threshold voltages VthP. In addition, the relations are explained on the assumption that a voltage set at the voltage level of the first power-supply voltage VDD1 is supplied to the node N13.

When the voltage V (N3) appearing at the node N3 is lower than the sum of the first power-supply voltage VDD1 and the threshold voltage VthP of the PMOS transistor PM6, that is, for V (N3)<(VDD1+VthP), the PMOS transistor PM6 is put in an electrically non-conductive state while the NMOS transistor NM4 is electrically conductive in a saturated region. Thus, a voltage V (N11) obtained as a result of subtracting the threshold voltage VthN of the NMOS transistor NM4 from the first power-supply voltage VDD1 is supplied to the node N11. That is, V (N11) (=VDD1−VthN) is supplied to the node N11 as indicated by a line (I) shown in FIG. 7. When the threshold voltage VthN of the NMOS transistor NM4 is deep in comparison with the threshold voltage of the PMOS transistor PM5, the PMOS transistor PM5 is put in an electrically conductive state.

The above description is based on the assumption that a voltage V (N13) set at the voltage level of the first power-supply voltage VDD1 is supplied to the node N13. However, the voltage V (N13) can also be a voltage supplied to the node N13 after being reduced by the voltage-drop circuit B11. In this case, a voltage equal to (V (N13)−VthN) is supplied to the node N11 as indicated by a line (II) shown in FIG. 7 where V (N13) is a voltage dropped by the voltage-drop circuit B11. In this case the voltage level applied to the node N11 is (V(N13)−VthN). Thus, the PMOS transistor PM5 can be put in an electrically conductive state even if the threshold voltage VthN of the NMOS transistor NM4 is equivalent to or even shallower than the threshold voltage VthP of the PMOS transistor PM5.

In addition, since the PMOS transistor PM7 is also put in an electrically non-conductive state, the second power-supply voltage VDD2 supplied to the node N3 is not supplied to the node N1A.

Thus, a signal generated by the first circuit group at a high level is supplied to the node N1A wired to the gate of the PMOS transistor PM1 by way of the PMOS transistor PM5. Normally, this signal has the voltage level of the first power-supply voltage VDD1 as shown in FIG. 8. Since a voltage applied between the gate and drain of the PMOS transistor PM1 is small in comparison with the threshold voltage of the PMOS transistor PM1, the PMOS transistor PM1 is sustained in an electrically non-conductive state. Thus, an electrical path from the node N3 to the line of the first power-supply voltage VDD1 is not formed.

When the voltage V (N3) appearing at the node N3 is equal to or larger than the sum of the first power-supply voltage VDD1 and the threshold voltage VthP of the PMOS transistor PM6, that is, for V (N3)≧(VDD1+VthP), a voltage at least equal to the threshold voltage VthP of the PMOS transistor PM6 is applied to the gate of the PMOS transistor PM6, putting the PMOS transistor PM6 in an electrically conductive state. With the PMOS transistor PM6 put in an electrically conductive state, the node N11 is linked to the node N3, that is, V (N11)=V (N3) as shown in FIG. 7. Thus, the voltage V (N11) becomes equal to the second power-supply voltage VDD2 and the PMOS transistor PM5 is put in an electrically non-conductive state. On the other hand, the PMOS transistor PM7 having the same threshold VthP is put in an electrically conductive state, linking the node N1A to the node N3, that is, V (N1A)=V (N3) as shown in FIG. 8. Thus, the voltage V (N1A) becomes equal to the second power-supply voltage VDD2. At the PMOS transistor PM1, the electric potential appearing at the gate becomes equal to the electric potential appearing at the drain so that the PMOS transistor PM1 is sustained in the electrically non-conductive state. Thus, an electrical path from the node N3 to the line of the first power-supply voltage VDD1 is not formed.

As described above, the use of the gate voltage control unit 11 shown in FIG. 6 in the fourth method allows a voltage applied to the node N1A (or N2) wired to the gate of the PMOS transistor PM1 (or PM3) to be switched in accordance with the second power-supply voltage VDD2 relative to the first power-supply voltage VDD1 even if the second power-supply voltage VDD2 is applied directly to the node N3 (or N4) wired to the drain of the PMOS transistor PM1 (or PM3) when the PMOS transistor PM1 (or PM3) is put in an electrically non-conductive state so that the PMOS transistor PM1 (or PM3) can be sustained in an electrically non-conductive state. Since an unnecessary current electrical path from the node N3 (or N4) wired to the drain of the PMOS transistor PM1 (or PM3) to the line of the first power-supply voltage VDD1 is not created, wasteful current consumption can be avoided. When the threshold voltage VthP of the PMOS transistor PM1 (or PM3) is set at the same value as those of the PMOS transistors PM6 and PM7, the voltage applied to the node N1A (or N2) wired to the gate of the PMOS transistor PM1 (or PM3) can be switched with a voltage at which the PMOS transistor PM1 (or PM3) starts to enter an electrically conductive state from the drain side to the side of the first power-supply voltage VDD1 due to the voltage appearing at the node N3 (or N4) connected to the drain of the PMOS transistor PM1 (or PM3).

In addition, the PMOS transistor PM1 (or PM3) can be sustained in an electrically non-conductive state in a stable manner independently of whether the threshold voltage of the PMOS transistor PM1 (or PM3) is equal to or different from the threshold voltage of the PMOS transistors PM2, PM4 and PM51.

Propagation of a signal from the first circuit group to the node 1A can be controlled by controlling the electrical conduction of the PMOS transistor PM5. By putting the PMOS transistor PM5 in an electrically non-conductive state, the second power-supply voltage VDD2 supplied to the node N1A is not applied to the first circuit group. In addition, by operating the NMOS transistor NM3 in a saturated region, a voltage applied to the first circuit group is limited to a voltage obtained as a result of subtracting the threshold voltage from the first power-supply voltage VDD1 and, hence, no over-voltage is applied to the first circuit group.

Next, an N-well electric-potential control unit 9 shown in FIG. 6 is explained. In the high-side level conversion circuit 4 employed in the level conversion circuit 1 and the gate voltage control unit 11 shown in FIG. 6, the first power-supply voltage VDD1 is used as the power-supply voltage and, in general, an N-well electric potential also biases the first power-supply voltage VDD1. For the PMOS transistors PM1 (or PM3) and PM5 to PM7, however, when the second power-supply voltage VDD2 is supplied to the nodes N3 and N1A, due to a difference in level between the first power-supply voltage VDD1 and the second power-supply voltage VDD2, a forward-direction current may flow in some cases by way of a junction biased in the forward direction from the P-type drain to an N well NW. In order to avoid this phenomenon, the electric potential of the N well NW needs to be controlled.

Figure 9:
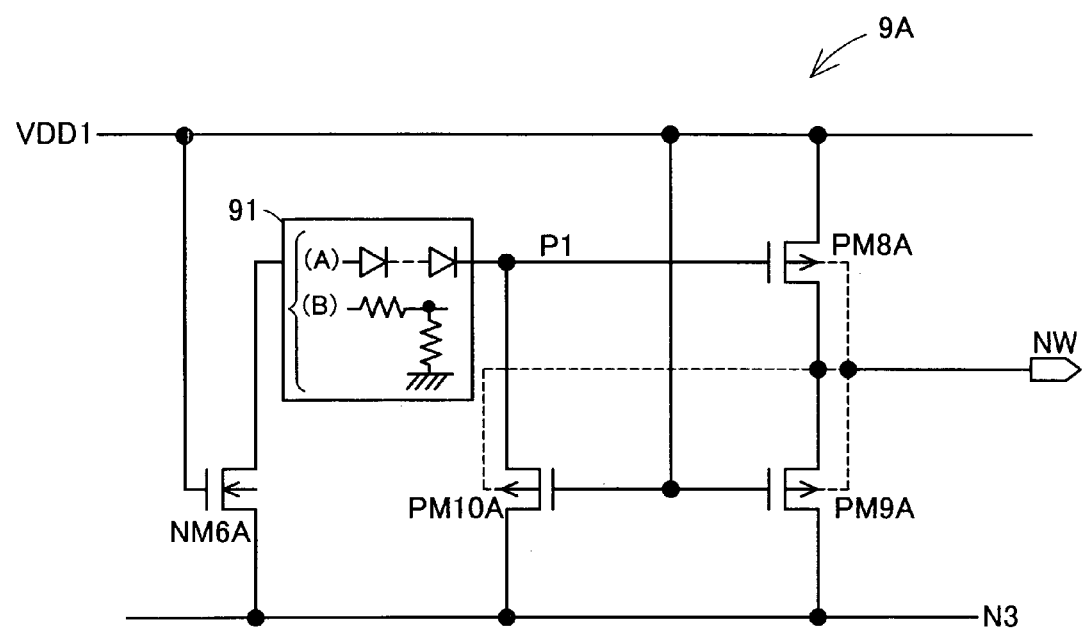
FIG. 9 is a circuit diagram showing a first concrete typical embodiment of an N-well electric-potential control unit for the fourth method.

FIG. 9 is a diagram showing an N-well electric-potential control unit 9A as a first concrete typical embodiment. The N-well electric-potential control unit 9A includes a PMOS transistor PM8A and a PMOS transistor PM9A. The source of the PMOS transistor PM8A is connected to the line of the first power-supply voltage VDD1 whereas the drain and back gate of the PMOS transistor PM8A are connected to the N well NW. The source of the PMOS transistor PM9A is connected to the node N3 whereas the drain and back gate of the PMOS transistor PM9A are connected to the N well NW. The gate of the PMOS transistor PM9A is connected to the line of the first power-supply voltage VDD1.

The gate of the PMOS transistor PM8A is wired to a node P1, which is connected to a PMOS-transistor control unit for controlling the electrical conduction/non-conduction of the PMOS transistor PM8A.

The PMOS-transistor control unit comprises an NMOS transistor NM6A, a PMOS transistor PM10A and, if necessary, a first voltage-drop unit 91. The drain of the NMOS transistor NM6A is connected to the node N3 and the source of the NMOS transistor NM6A is connected to the gate of the PMOS transistor PM8A at the node P1 through the first voltage-drop unit 91. The gate of the NMOS transistor NM6A is connected to the line of the first power-supply voltage VDD1. The source of the PMOS transistor PM10A is connected to the node N3 whereas the drain of the PMOS transistor PM10A is connected to the gate of the PMOS transistor PM8A. The back gate and gate of the PMOS transistor PM10A are connected to the N well MW and the line of the first power-supply voltage VDD1 respectively.

The first voltage-drop unit 91 causes a voltage drop from a voltage appearing at the source of the NMOS transistor NM6A and supplies the reduced voltage to the node P1, which is wired to the gate of the PMOS transistor PM8A.

In FIG. 9, typical embodiment A or B of the first voltage-drop unit 91 are also shown. Typical embodiment A has a predetermined number of diodes connected to each other in series to cause the voltage drop. By properly setting the number of diodes, a voltage not equal to or larger than a voltage obtained as a result of subtracting the threshold voltage from the first power-supply voltage VDD1 is supplied from the first voltage-drop unit 91 to the node P1, which is wired to the gate of the PMOS transistor PM8A, to put the PMOS transistor PM8A in an electrically conductive state. On the other hand, typical embodiment B divides the voltage appearing at the source of the NMOS transistor NM6A by using resistors. By properly setting the voltage-division ratio, a voltage not equal to or larger than a voltage obtained as a result of subtracting the threshold voltage from the first power-supply voltage VDD1 is supplied from the first voltage-drop unit 91 to the node P1, which is wired to the gate of the PMOS transistor PM8A.

Figure 10:
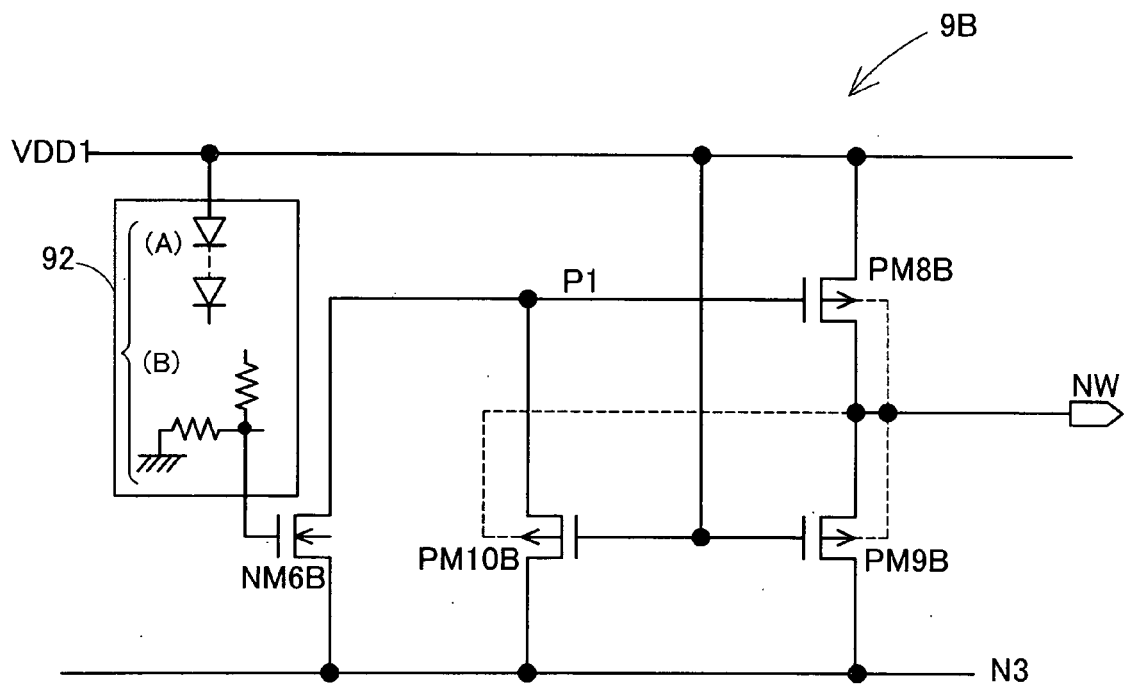
FIG. 10 is a circuit diagram showing a second concrete typical embodiment of the N-well electric-potential control unit for the fourth method.

The N-well electric-potential control unit 9B as a second concrete typical embodiment shown in FIG. 10 includes a second voltage-drop unit 92 in a PMOS-transistor control unit in place of the first voltage-drop unit 91 employed in the first embodiment 9A of the N-well electric-potential control unit 9 shown in FIG. 9.

In the PMOS-transistor control unit, the source of the NMOS transistor NM6B is connected directly to the gate of the PMOS transistor PM8B at the node P1 and the gate of the NMOS transistor NM6B is connected to the line of the first power-supply voltage VDD1 through the second voltage-drop unit 92.

The second voltage-drop unit 92 causes a voltage drop from the first power-supply voltage VDD1, outputting a bias voltage to the gate of the NMOS transistor NM6B. Thus, a properly reduced voltage is output at the source of the NMOS transistor NM6B, being supplied to the node P1.

Concrete typical embodiments of the second voltage-drop unit 92 shown in FIG. 10 are similar to the typical concrete embodiments of the first voltage-drop unit 91. To put it concretely, typical concrete embodiment A of the second voltage-drop unit 92 has a predetermined number of diodes connected to each other in series to cause the voltage drop from the first power-supply voltage VDD1. On the other hand, typical concrete embodiment B of the second voltage-drop unit 92 divides the first power-supply voltage VDD1 by using resistors.

Figure 11:
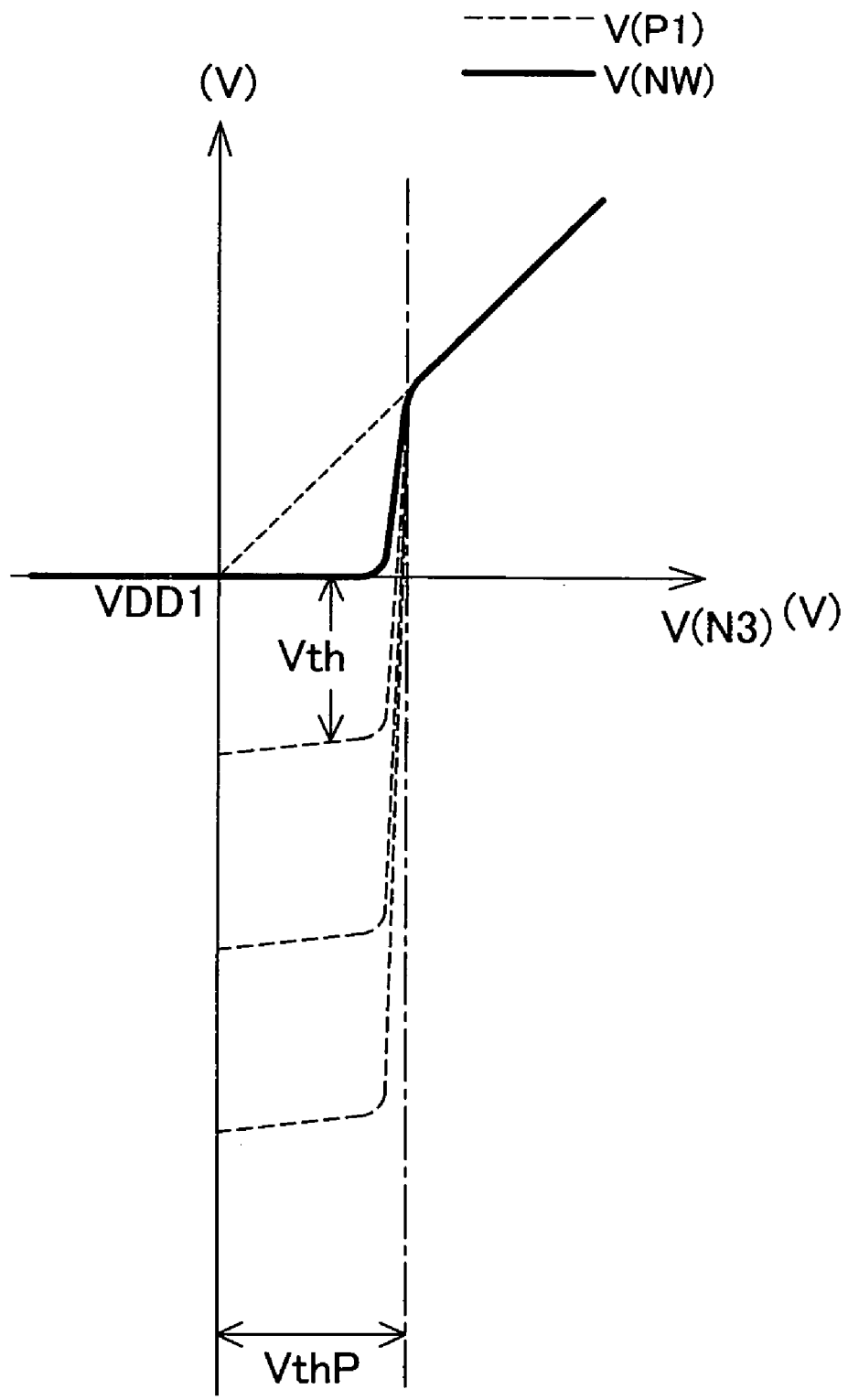
FIG. 11 is a diagram showing a well electric potential varied by the first and second concrete typical embodiments of the N-well electric-potential control unit.

FIG. 11 is a diagram showing a relation between a voltage V (N3) appearing at the node N3 and an electric potential V (NW) of the N well NW as well as a relation between a voltage V (N3) and a voltage V (P1) appearing at the gate of the PMOS transistor PM8A for the N-well electric-potential control unit 9A shown in FIG. 9 and the N-well electric-potential control unit shown in FIG. 10. The relations shown in FIG. 11 are relations obtained for a case in which the threshold voltage of the NMOS transistors is about equal to the threshold voltage of the PMOS transistors, that is, for VthN≈VthP.

When the voltage V (N3) becomes equal to or larger than the sum of the first power-supply voltage VDD1 and the threshold voltage VthP, that is, for V (N3)≧(VDD1+VthP), the PMOS transistor PM10A (or PM10B) is put in an electrically conductive state. Thus, the voltage V (N3) is biased by the voltage V (P1) is supplied to the second power-supply voltage VDD2, putting the PMOS transistor PM8A (or PM8B) in an electrically non-conductive state. Since the PMOS transistor PM9A (or PM9B) is in an electrically conductive state, on the other hand, the electric potential V (NW) of the N well becomes equal to the voltage V (N3), that is, the electric potential V (NW) of the N well becomes equal to the second power-supply voltage VDD2.

When the voltage V (N3) becomes smaller than the sum of the first power-supply voltage VDD1 and the threshold voltage VthP, that is, for V (N3)<(VDD1+VthP), the PMOS transistors PM9A and PM10A (or PM9B and PM10B) are put in an electrically non-conductive state. On the other hand, the NMOS transistor NM6A (or NM6B) is put in an electrically conductive state.

The NMOS transistor NM6A (or NM6B) operates in a saturated region till the voltage V (N3) decreases to a voltage at a level obtained as a result of subtracting the threshold voltage VthN of the NMOS transistor NM6A (or NM6B) from the voltage appearing at the gate of the NMOS transistor NM6A (or NM6B). Thus, the voltage appearing at the source of the NMOS transistor NM6A (or NM6B) is approximately fixed at the level obtained as a result of subtracting the threshold voltage VthN of the NMOS transistor NM6A (or NM6B) from the voltage appearing at the gate of the NMOS transistor NM6A (or NM6B). As the voltage V (N3) decreases further to an even lower level, the NMOS transistor NM6A (or NM6B) operates linearly in the electrically conductive state, outputting the voltage V (N3) to the source of the NMOS transistor NM6A (or NM6B) as it is.

The voltage supplied to the gate of the NMOS transistor NM6A is the first power-supply voltage VDD1 as shown in FIG. 9. On the other hand, the voltage supplied to the gate of the NMOS transistor NM6B is a voltage obtained as a result of subtracting the voltage from the first power-supply voltage VDD1 as shown in FIG. 10. The voltage supplied to the gate of the NMOS transistor NM6A shown in FIG. 9 is supplied to the node P1, which is wired to the gate of the PMOS transistor PM8A. The voltage supplied to the gate of the NMOS transistor NM6B shown in FIG. 10 is applied to the node P1, which is wired to the gate of the PMOS transistor PM8B. When the first voltage-drop unit 91 and the second voltage-drop unit 92 is not used, the voltage V (P1) is set at a value in a range having an upper limit equal to a voltage obtained as a result of subtracting the threshold voltage VthN of the NMOS transistor NM6A (or NM6B) from the first power-supply voltage VDD1.

When the threshold voltage of the NMOS transistor NM6A (or NM6B) is about equal to the threshold voltage of the NMOS transistor NM8A (or NM8B), an electric-potential difference equal to or larger than the threshold voltage VthP is applied between the gate and source of the PMOS transistor PM8A (or PM8B), causing the PMOS transistor PM8A (or PM8B) to enter an electrically conductive state, which supplies the first power-supply voltage VDD1 to the N well.

Even if the threshold voltage of the NMOS transistor NM6A (or NM6B) is different from the threshold voltage of the PMOS transistor PM8A (or PM8B), by employing at least either one of the first voltage-drop unit 91 and the second voltage-drop unit 92, the voltage V (P1) appearing at the node P1 can be sufficiently lowered to put the PMOS transistor PM8A (or PM8B) in an electrically conductive state.

Figure 12:
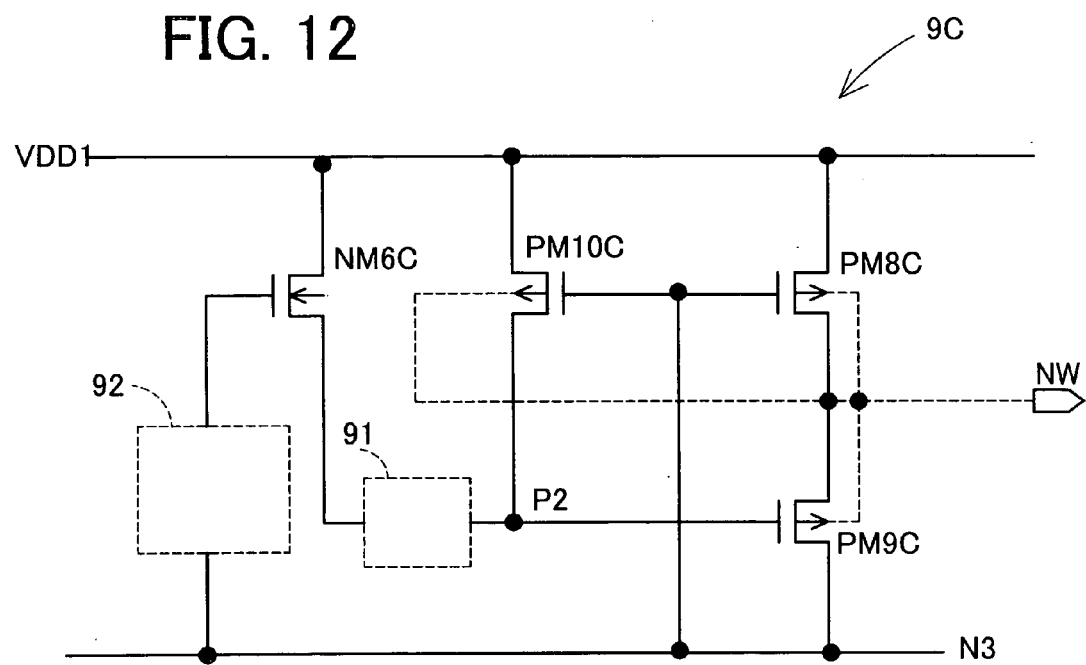
FIG. 12 is a circuit diagram showing a third concrete typical embodiment of the N-well electric-potential control unit for the fourth method.

FIG. 12 is a diagram showing the N-well electric-potential control unit 9C as a third concrete typical embodiment. In the first embodiment 9A shown in FIG. 9 or the second embodiment 9B shown in FIG. 10, the PMOS-transistor control unit controls the PMOS transistor PM8A (or PM8B). The gate of the PMOS transistor PM9A (or PM9B) is connected to the first power-supply voltage VDD1. In the third embodiment 9C, on the other hand, a connecting relation is inverted. That is to say, an NMOS transistor NM6C and a PMOS transistor PM10C are placed between the gate of the PMOS transistor PM9C and the line of the first power-supply voltage VDD1. The gate of the NMOS transistor NM6C is connected to the node N3. The gates of the PMOS transistors PM8C and 10C are also connected to the node N3. In the third embodiment 9C, the first voltage-drop unit 91 and the second voltage-drop unit 92 can be inserted in the same ways as the second concrete typical embodiment 9A, 9B. To put it concretely, the first voltage-drop unit 91 can be inserted between the NMOS transistor NM6C and the node P2. On the other hand, the second voltage-drop unit 92 can be inserted between the gate of the NMOS transistor NM6C and the node N3.

Figure 13:
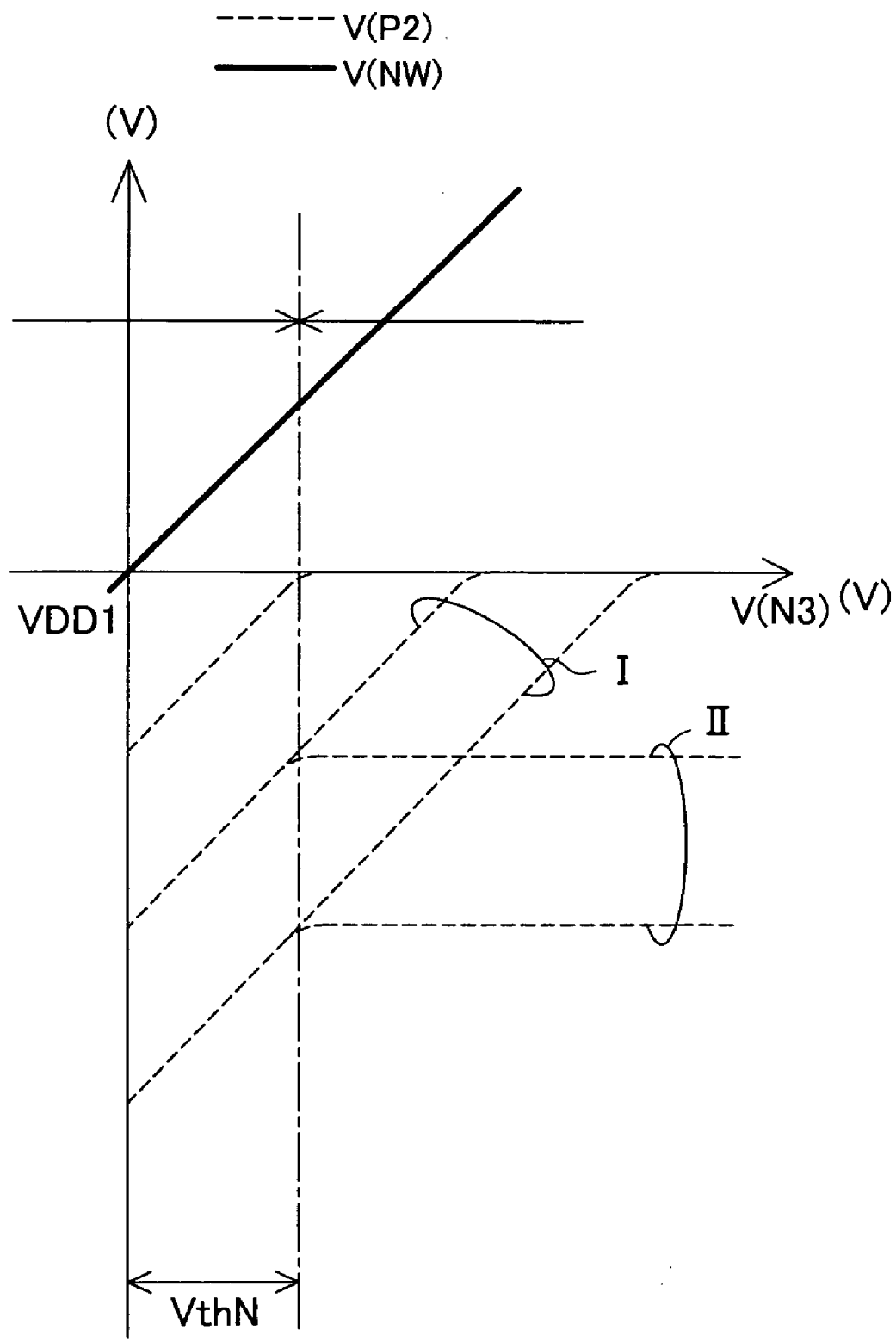
FIG. 13 is a diagram showing a well electric potential varied by the third concrete typical embodiment of the N-well electric-potential control unit.

FIG. 13 is a diagram showing a relation between the voltage V (N3) and the electric potential V (NW) of the N well as well as a relation between the voltage V (N3) and the voltage V (P2) appearing at the node P2 for the third embodiment 9C. When the first voltage-drop unit 91 and the second voltage-drop unit 92 are not used, at a voltage V (N3) not equal to or larger than the sum of the first power-supply voltage VDD1 and the threshold voltage VthN, the NMOS transistor NM6C operates in a saturated region. In this state, the voltage V (P2) applied to the node P2 wired to the gate of the PMOS transistor PM9C is supplied to a voltage obtained as a result of subtracting the threshold voltage VthN from the voltage V (N3). Under the condition that the threshold voltage of the NMOS transistor is about equal to the threshold voltage of the PMOS transistor, that is, for VthN≈VthP, the PMOS transistor PM9C is put in an electrically conductive state, outputting the voltage V (N3) as the electric potential V (NW) of the N well. In this state, the voltage V (N3) is equal to the second power-supply voltage VDD2. Thus, the electric potential V (NW) of the N well is also equal to the second power-supply voltage VDD2.

As the voltage V (N3) exceeds the sum of the first power-supply voltage VDD1 and the threshold voltage VthN, the NMOS transistor NM6C operates linearly. In this state, the first power-supply voltage VDD1 is supplied to the node P2 wired to the gate of the PMOS transistor PM9C, causing the PMOS transistor PM9C to enter an electrically conductive state, which outputs the voltage V (N3) as the electric potential V (NW) of the N well. In this state, the voltage V (N3) is equal to the second power-supply voltage VDD2. Thus, the electric potential V (NW) of the N well is also equal to the second power-supply voltage VDD2.

It is to be noted that since the effects of the first voltage-drop unit 91 and the second voltage-drop unit 92 are the same as those for the first embodiment 9A and the second embodiment 9B, their descriptions are not repeated. A voltage drop caused by the first voltage-drop unit 91 exhibits an effect that, for a voltage V (N3) equal to or larger than the sum of the first power-supply voltage VDD1 and the threshold voltage VthN, the voltage V (P2) is set at a voltage level obtained as a result of subtracting the voltage from the first power-supply voltage VDD1 as indicated by lines (II) shown in FIG. 13, whereas a voltage drop caused by the second voltage-drop unit 92 exhibits an effect that the voltage V (P2) is set at a voltage level, which is obtained as a result of subtracting the voltage from the first power-supply voltage VDD1 to result in a difference and further subtracting the threshold voltage VthN from the resulting difference as indicated by lines (I) shown in FIG. 13.

As described above, in accordance with the first embodiment 9A shown in FIG. 9, the second embodiment 9B shown in FIG. 10 or the third embodiment 9C shown in FIG. 12, by employing the first voltage-drop unit 91, a voltage drop from a voltage appearing at the source of the NMOS transistor NM6A, NM6B or NM6C can be generated.

By employing the second voltage-drop unit 92, the predetermined voltage applied to the gate the NMOS transistor NM6A, NM6B or NM6C can be dropped from the first power-supply voltage VDD1 so that the level of the voltage appearing at the source of the NMOS transistor NM6A, NM6B or NM6C operating in a saturated region can be reduced.

By employing the first voltage-drop unit 91 and the second voltage-drop unit 92, the voltages supplied to the nodes P1 and P2 can be reduced to a level obtained as a result of subtracting the threshold voltage VthN and the voltage drops from the first power-supply voltage VDD1. In addition, since the first voltage-drop unit 91 results in a fixed voltage drop, also in a region where the NMOS transistor NM6A, NM6B or NM6C operates linearly, a predetermined voltage drop can be resulted in.

By employing both the first voltage-drop unit 91 and the second voltage-drop unit 92, the voltage drops are added to each other to effectively lower the voltages V (P1) and V (P2), which appear at the nodes P1 and P2 wired to the gates of the PMOS transistor PM8A (or PM8B) and the PMOS transistor PM9C respectively with the PMOS transistor PM8A, PM8B or PM9C put in an electrically conductive state. The first voltage-drop unit 91 is capable of exhibiting the same effect without regard to whether the first voltage-drop unit 91 is employed alone or used in conjunction with the second voltage-drop unit 92. By the same token, the second voltage-drop unit 92 is capable of exhibiting the same effect without regard to whether the second voltage-drop unit 92 is employed alone or used in conjunction with the first voltage-drop unit 91.

The electric potential V (NW) of the N well NW for each of the PMOS transistor PM1 (or PM3) and the PMOS transistors PM5 to PM7 is controlled in accordance with the voltage V (N3) (or V (N4)) applied to the node N3 (or N4) over a seamless range of the voltage V (N3) (or V (N4)) resulting in no floating state. To be more specific, for V (N3) (or V (N4))<(VDD1+VthP), the electric potential V (NW) is biased to the first power-supply voltage VDD1 and, for V (N3) (or V (N4))≧(VDD1+VthP), the electric potential V (NW) is biased to the voltage V (N3) (or V (N4)). Thus, the N well NW never enters a floating state. In addition, a forward bias is also never applied between junctions with drains. As a result, the electric potential V (NW) of the N well NW is set with a high certainly in level conversion from the level of the first circuit group 3 to that of the second circuit group 5, and no unnecessary forward bias current flows. Accordingly, a stable circuit operation can be implemented with low current consumption.

FIG. 14 is a diagram showing a concrete typical embodiment implementing the low-side level conversion circuit 6 employed in the level conversion circuit 1 implemented by the embodiment described above. The low-side level conversion circuit 6 converts the level of the input signal IN having an amplitude equal to the first power-supply voltage VDD1 into a signal having an amplitude equal to the bias voltage VB.

The input signal IN is supplied to an inverter gate comprising a PMOS transistor PM62 and an NMOS transistor NM62 and also supplied to the gate of an NMOS transistor NM61. The output terminal of the inverter gate is connected to the gate of an NMOS transistor NM63. The sources of the NMOS transistors NM61 and NM63 are connected to the line of the reference voltage VSS whereas the drains of the NMOS transistors NM61 and NM63 are connected to the drains of PMOS transistors PM61 and PM63 respectively. The gate of the PMOS transistor PM61 is connected to the drain of the PMOS transistor PM63 while the gate of the PMOS transistor PM63 is connected to the drain of the PMOS transistor PM61. The sources of the PMOS transistors PM61 and PM63 are connected to the bias voltage VB through a voltage-drop unit 71 if necessary. A signal obtained as a result of the level conversion is output from a connection point between the PMOS transistor PM63 and the NMOS transistor NM63.

An input signal IN set at a high level is received, putting the NMOS transistor NM61 in an electrically conductive state. The voltage appearing at the gate of the PMOS transistor PM63 is brought to the level of the reference voltage VSS, causing the PMOS transistor PM63 to enter an electrically conductive state. In addition, a low-level signal obtained as a result of inversion by the inverter gate is supplied to the gate of the NMOS transistor NM63, putting the NMOS transistor NM63 in an electrically non-conductive state. Thus, the bias voltage VB or a voltage lower than the bias voltage VB is output to the connection point by way of the PMOS transistor PM63 as an output signal. The output signal is also supplied to the gate of the PMOS transistor PM61, causing the PMOS transistor PM61 to enter an electrically non-conductive state.

Now, assume that the received input signal IN is set at a low level of the reference voltage VSS. In this case, the NMOS transistor NM61 is put in an electrically non-conductive state, cutting off an electrical path from the gate of the PMOS transistor PM63 to the line of the reference voltage VSS. On the other hand, a high-level signal obtained as a result of inversion by the inverter gate is supplied to the gate of the NMOS transistor NM63, putting the NMOS transistor NM63 in an electrically conductive state. Thus, the reference voltage VSS is output to the connection point mentioned above by way of the NMOS transistor NM63 as an output signal. The output signal is also supplied to the gate of the PMOS transistor PM61, causing the PMOS transistor PM61 to enter an electrically conductive state and sustaining the PMOS transistor PM63 in an electrically non-conductive state.

As described above, the high level of the output signal is the level of the bias voltage VB or a voltage lower than the bias voltage VB by the voltage drop. By setting this level at a level higher than the first power-supply voltage VDD1, the gate of the NMOS transistor NM51 is deeply biased, leading to an expectation of an increased driving power and a raised operation speed.

In accordance with the present invention, when a signal is subjected to interfacing between a first circuit group operating at a first power-supply voltage and a second circuit group operating at a second power-supply voltage higher than the first power-supply voltage, by providing a level conversion circuit operating by being driven by a power supply having a voltage level between the first power-supply voltage and the second power-supply voltage, a semiconductor device capable of converting a voltage level without continuous current consumption can be provided.

What is claimed is:

1. A semiconductor device comprising:
a first circuit group operating by being driven by a power supply at a voltage level between a reference voltage and a first power-supply voltage,
a second circuit group, which operates by being driven by a power supply at a voltage level between the reference voltage and a second power-supply voltage, which is higher than the first power-supply voltage,
a high-side voltage-controlled device having a first type of electrical conduction at an input stage of the second circuit group for controlling an output of the second power-supply voltage; and
a level conversion circuit, which is provided as an interface from the first circuit group to the second circuit group, operates by being driven by a power supply at a voltage level between the first power-supply voltage and the second power-supply voltage to control electrical conduction of the high-side voltage-controlled device and has:
a first voltage-controlled device, which has the first type of electrical conduction and is provided directly between the high-side voltage-controlled device and a line of the first power-supply voltage for supplying the first power-supply voltage with the high-side voltage-controlled device put in an electrically conductive state; and
a second voltage-controlled device, which has the first type of electrical conduction and is provided between the high-side voltage-controlled device and a line of the second power-supply voltage for supplying the second power-supply voltage with the high-side voltage-controlled device put in an electrically non-conductive state.

2. A semiconductor device according to claim 1 wherein the level conversion circuit is interfaced with the first circuit group at the first voltage-controlled device.

3. A semiconductor device according to claim 1 wherein the level conversion circuit further includes:
a third voltage-controlled device, which has the first type of electrical conduction and is provided between the second voltage-controlled device and a line of the first power-supply voltage for supplying the first power-supply voltage with the second voltage-controlled device put in an electrically conductive state; and
a fourth voltage-controlled device, which has the first type of electrical conduction and is provided between the second voltage-controlled device and a line of the second power-supply voltage for supplying the second power-supply voltage with the second voltage-controlled device put in an electrically non-conductive state.

4. A semiconductor device according to claim 3 wherein the fourth voltage-controlled device enters an electrically conductive state when the first voltage-controlled device supplies the first power-supply voltage, and enters an electrically non-conductive state when the second voltage-controlled device supplies the second power-supply voltage.

5. A semiconductor device according to claim 3 wherein the level conversion circuit is interfaced with the first circuit group at the third voltage-controlled device.

6. A semiconductor device comprising:
a first circuit group operating by being driven by a power supply at a voltage level between a reference voltage and a first power-supply voltage,
a second circuit group, which operates by being driven by a power supply at a voltage level between the reference voltage and a second power-supply voltage, which is higher than the first power-supply voltage,
an output PMOS transistor at an input stage of the second circuit group with a gate driven by the first power-supply voltage to deliver an output of the second power-supply voltage; and
a level conversion circuit, which is provided as an interface from the first circuit group to the second circuit group, operates by being driven by a power supply at a voltage level between the first power-supply voltage and the second power-supply voltage to control electrical conduction of the output PMOS transistor and has:
a first PMOS transistor provided on an electrical path from a line of the first power-supply voltage to a gate of the output PMOS transistor and controlled to enter an electrically conductive state by a first signal supplied by the first circuit group to a gate of the first PMOS transistor;
a second PMOS transistor provided on an electrical path from a line of the second power-supply voltage to the gate of the output PMOS transistor and controlled to enter an electrically conductive state by the first power-supply voltage supplied to a gate of the second PMOS transistor;
a third PMOS transistor provided on an electrical path from the line of the first power-supply voltage to a gate of the second PMOS transistor and controlled to enter an electrically conductive state by a second signal supplied by the first circuit group to a gate of the third PMOS transistor; and
a fourth PMOS transistor provided on an electrical path from the line of the second power-supply voltage to the gate of the second PMOS transistor and controlled to enter an electrically conductive state or an electrically non-conductive state by the first or second power-supply voltage to a gate of the fourth PMOS transistor by way of the first or second PMOS transistor respectively,
wherein either the first PMOS transistor or the third PMOS transistor is controlled to enter an electrically conductive state.

7. A semiconductor device according to claim 6 wherein the first signal and the second signal are logically inverted signals to each other.

8. A semiconductor device according to claim 6, the semiconductor device further including:
a first NMOS transistor provided on an electrical path from the first PMOS transistor to a junction of the second PMOS transistor and a gate of the output PMOS transistor or a path to the gate of the output PMOS transistor; and
a second NMOS transistor provided on an electrical path from the third PMOS transistor to a junction of the fourth PMOS transistor and a gate of the second PMOS transistor or a path to the gate of the second PMOS transistor, wherein:
a predetermined bias voltage is applied steadily to gates of the first and second NMOS transistors;
the first NMOS transistor is put in an electrically conductive state when the first signal puts the first PMOS transistor in an electrically conductive state, or the second NMOS transistor is put in an electrically conductive state when the second signal puts the third PMOS transistor in an electrically conductive state; and
when the first signal puts the first PMOS transistor in an electrically non-conductive state, a voltage lower than a voltage appearing at a drain of the first NMOS transistor by a voltage drop is applied to the first PMOS transistor or, when the second signal puts the third PMOS transistor in an electrically non-conductive state, a voltage lower than a voltage appearing at a drain of the second NMOS transistor by a voltage drop is applied to the third PMOS transistor.

9. A semiconductor device according to claim 8 wherein the gates of the first and second NMOS transistors are connected to a predetermined bias voltage generator.

10. A semiconductor device according to claim 9 comprising: a voltage-drop unit provided on an electrical path from the predetermined bias voltage generator to the gates of the first and second NMOS transistors.

11. A semiconductor device according to claim 10 wherein the voltage-drop unit comprises a diode, a transistor which is connected as conducting diode function, diodes provided at a plurality of stages, transistors provided at a plurality of stages or a combination of such diodes and/or such transistors.

12. A semiconductor device according to claim 9 wherein the predetermined bias voltage generator is a generator of the second power-supply voltage or an external voltage generator.

13. A semiconductor device according to claim 6 wherein a threshold voltage of the first and third PMOS transistors is deep in comparison with a threshold voltage of the output PMOS transistor as well as the second and fourth PMOS transistors.

14. A semiconductor device according to claim 6, further including a gate-voltage control unit provided at a gate of each of the first and third PMOS transistors for controlling a voltage applying at the gate, wherein:
the voltage applying at the gate of the first or third PMOS transistor is set at the second power-supply voltage when the second power-supply voltage applied to a drain of the first or third PMOS transistor is equal to or larger than a sum obtained as a result of adding a first predetermined voltage to the first power-supply voltage; or
the voltage applying at the gate of the first or third PMOS transistor is set at the first power-supply voltage when the second power-supply voltage applied to the drain of the first or third PMOS transistor is lower than the sum obtained as a result of adding the first predetermined voltage to the first power-supply voltage.

15. A semiconductor device according to claim 14 wherein the sum obtained as a result of adding the first predetermined voltage to the first power-supply voltage is a voltage causing the first or third PMOS transistor to start conducting electrically from a drain side to a side of the first power-supply voltage.

16. A semiconductor device according to claim 14 wherein the first predetermined voltage is a voltage, which corresponds to a threshold voltage of the first or third PMOS transistor at a time the first or third PMOS transistor starts conducting electrically from a drain side to a side of the first power-supply voltage.

17. A semiconductor device according to claim 14 wherein the gate-voltage control unit:
   is provided between the first circuit group and a gate of the first or third PMOS transistor;
   includes a first gate-voltage control unit, which is used for preventing the second power-supply voltage from being supplied from the gate of the first or third PMOS transistor to the first circuit group when the gate of the first or third PMOS transistor is set at the second power-supply voltage and for electrically connecting the first circuit group to the gate of the first or third PMOS transistor when the gate of the first or third PMOS transistor is set at the first power-supply voltage.

18. A semiconductor device according to claim 17 wherein the first gate-voltage control unit includes a fifth PMOS transistor having a drain connected to the first circuit group and a source connected to the gate of the first or third PMOS transistor.

19. A semiconductor device according to claim 17 wherein the first gate-voltage control unit includes a third NMOS transistor having a drain connected to the first circuit group, a source connected to the gate of the first or third PMOS transistor and a gate connected to a line of the first power-supply voltage.

20. A semiconductor device according to claim 18 wherein the gate-voltage control unit has a second gate-voltage control unit, which is used for:
   setting a gate of the fifth PMOS transistor at the second power-supply voltage when the gate of the first or third PMOS transistor is set at the second power-supply voltage; and
   setting the gate of the fifth PMOS transistor at a voltage lower than a voltage causing the fifth PMOS transistor to start entering an electrically conductive state when the gate of the first or third PMOS transistor is set at the first power-supply voltage.

21. A semiconductor device according to claim 20 wherein the voltage causing the fifth PMOS transistor to start entering an electrically conductive state is a voltage obtained as a result of subtracting a voltage corresponding to a threshold voltage of the fifth PMOS transistor from the first power-supply voltage.

22. A semiconductor device according to claim 20 wherein the second gate-voltage control unit includes a sixth PMOS transistor having a source connected to a drain of the first or third PMOS transistor, a drain connected to a gate of the fifth PMOS transistor and a gate connected to a line of the first power-supply voltage.

23. A semiconductor device according to claim 22 wherein the second gate-voltage control unit includes a fourth NMOS transistor having a drain connected to the drain of the first or third PMOS transistor, a source connected to the gate of the fifth PMOS transistor and a gate controlled by the first or second signal or a signal having the same phase as the first or second signal.

24. A semiconductor device according to claim 23 wherein the first power-supply voltage or a voltage lower than the first power-supply voltage by a voltage drop is supplied to the gate of the fourth NMOS transistor.

25. A semiconductor device according to claim 24, the semiconductor device further having a voltage-drop unit for generating a voltage drop from a voltage level of the first or second signal or a signal having the same phase as the first or second signal and outputting a voltage having an output voltage level lowered from the voltage level by the voltage drop.

26. A semiconductor device according to claim 20 wherein the second gate-voltage control unit includes a fifth NMOS transistor having a drain connected to the gate of the fifth PMOS transistor, a source connected to a line of the reference voltage and a gate controlled by a signal inverted from the first or second signal.

27. A semiconductor device according to claim 6, further having an N-well electric-potential control unit, which is used for setting the electric potential of an N well of each of the first and third PMOS transistors when the second power-supply voltage is applied to a drain of the first or third PMOS transistor:
   at the second power-supply voltage when the second power-supply voltage is a voltage equal to or larger than the sum of the first power-supply voltage and a second predetermined voltage; or
   at the first power-supply voltage when the second power-supply voltage is a voltage lower than the sum of the first power-supply voltage and the second predetermined voltage.

28. A semiconductor device according to claim 27 wherein the N-well electric-potential control unit comprises:
   an eighth PMOS transistor having a source connected to a line of the first power-supply voltage as well as a drain and a back gate both connected to the N well;
   a ninth PMOS transistor having a source connected to a drain of the first or third PMOS transistor, a drain and a back gate both connected to the N well and a gate connected to a line of the first power-supply voltage; and
   a PMOS-transistor control unit connected to a gate of the eighth PMOS transistor and used for controlling electrical conduction of the eighth PMOS transistor.

29. A semiconductor device according to claim 28 wherein a voltage equal to the sum of the first power-supply voltage and the second predetermined voltage is a voltage causing the ninth PMOS transistor to start entering an electrically conductive state.

* * * * *